United States Patent
Choi et al.

(10) Patent No.: US 7,521,333 B2
(45) Date of Patent: Apr. 21, 2009

(54) METHODS OF FABRICATING TRENCH ISOLATION STRUCTURES HAVING VARYING DEPTH

(75) Inventors: Eun-Young Choi, Gyeonggi-do (KR); Jung-Min Son, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 11/363,688

(22) Filed: Feb. 28, 2006

(65) Prior Publication Data

US 2006/0220171 A1 Oct. 5, 2006

(30) Foreign Application Priority Data

Mar. 29, 2005 (KR) .................. 10-2005-0025984

(51) Int. Cl.
*H01L 21/76* (2006.01)

(52) U.S. Cl. ............... 438/427; 438/424; 257/E21.54; 257/E21.545; 257/E21.546; 257/E21.548; 257/E21.553

(58) Field of Classification Search ............ 438/427; 257/E21.546, E21.548
See application file for complete search history.

(56) References Cited

U.S. PATENT DOCUMENTS

| | | | | |
|---|---|---|---|---|
| 6,699,772 | B1 * | 3/2004 | Sharma | 438/424 |
| 6,818,528 | B2 * | 11/2004 | Mandelman et al. | 438/427 |
| 2003/0077875 | A1 * | 4/2003 | Mandelman et al. | 438/424 |
| 2004/0092115 | A1 * | 5/2004 | Hsieh et al. | 438/694 |
| 2005/0074938 | A1 * | 4/2005 | Han | 438/258 |
| 2005/0139865 | A1 * | 6/2005 | Choi | 257/204 |
| 2006/0051930 | A1 * | 3/2006 | Lee et al. | 438/424 |

FOREIGN PATENT DOCUMENTS

| | | | |
|---|---|---|---|
| JP | 60092632 | A * | 5/1985 |
| JP | 11-045874 | | 2/1999 |
| JP | 2000-208484 | | 7/2000 |
| JP | 2000-323564 | | 11/2000 |
| JP | 2004-128038 | | 4/2004 |
| JP | 2004-241586 | | 8/2004 |
| KR | 1020000067571 | A | 11/2000 |
| KR | 1020020074002 | A | 9/2002 |
| KR | 1020030018678 | A | 3/2003 |
| KR | 2004-0050408 | A | 6/2004 |

OTHER PUBLICATIONS

Notice to File a Response/Amendment to the Examination Report, Korean Application No. 10-2005-0025984, Jun. 26, 2006.

* cited by examiner

*Primary Examiner*—Davienne Monbleau
*Assistant Examiner*—Christopher M Roland
(74) *Attorney, Agent, or Firm*—Myers Bigel Sibley & Sajovec, P.A.

(57) ABSTRACT

A device isolation structure of semiconductor device includes a semiconductor substrate having a cell region, a low voltage region and a high voltage region defined therein. A cell trench isolation region is disposed in the cell region. A low voltage trench isolation region is disposed in the low voltage region and extends deeper into the substrate than the cell trench isolation region. A first high voltage trench isolation region is disposed in the high voltage region and extends deeper into the substrate than the low voltage trench isolation region. A second high voltage trench isolation region is disposed in the high voltage region and extends deeper into the substrate than the low voltage trench isolation region but shallower than the first high voltage trench isolation region.

9 Claims, 22 Drawing Sheets

METHODS OF FABRICATING TRENCH ISOLATION STRUCTURES HAVING VARYING DEPTH

CROSS-REFERENCE TO RELATED APPLICATION

This U.S. non-provisional patent application claims priority under 35 U.S.C. § 119 of Korean Patent Application 2005-25984 filed on Mar. 29, 2005, the entire contents of which are hereby incorporated by reference.

BACKGROUND OF THE INVENTION

The present invention relates to semiconductor devices and methods of fabricating the same, more particularly, to device isolation structures of semiconductor devices and methods of fabricating the same.

A typical semiconductor integrated circuit device has various components arranged in and/or on a substrate. The components are electrically connected in accordance to perform specific functions. The components are generally electrically isolated except for certain electrical connections. Device isolation structures are used to provide electric isolation between neighboring components.

As the level of integration of semiconductor devices has increased, the size of device isolation structures has decreased. In order to address this situation, a variety of new device isolation structures have been developed.

Semiconductor devices commonly include regions of varying circuit density. For example, a cell array region of a memory device may have a relatively high pattern density, while a peripheral circuit region of the memory device may have a relatively low pattern density. The peripheral circuit region may have portions with a relatively high operational voltage and portions with a relatively low operational voltage. It is generally desirable that a device isolation structure in the region with a high operation voltage has a high electric isolation ability. Accordingly, a depth of a device isolation structure in the high voltage region is commonly deeper than a device isolation structure in the low voltage region. Commonly, trench isolation is used in high voltage regions.

FIGS. 1 and 2 are cross-sectional views illustrating a device isolation structure of a conventional semiconductor device. The memory device illustrated in FIG. 1 has a cell region with a high pattern density. The high pattern density region includes a low voltage region with a low driving voltage and a high voltage region with a high driving voltage. A device isolation structure includes a cell trench isolation layer 22a formed in a cell region of a substrate 10, a low voltage trench isolation layer 22b formed in a low voltage portion of a peripheral region, and first and second high voltage trench isolation layers 22c and 22d formed in respective trenches 18 and 16 in a high voltage portion of a peripheral region. An insulation layer is also disposed in a cell trench 12 and a low voltage trench 14.

As a high operational voltage is applied in the high voltage region, it is preferable that trench isolation regions therein be relatively deep. However, the cell region and the low voltage region may have relatively high pattern density in comparison with the high voltage region. Thus, the aspect ratio of trenches in these regions may be high in comparison to those in the high voltage region. Accordingly, the trenches in the cell region and the low voltage region may not sufficiently fill with insulating material, and may therefore form voids 30.

SUMMARY OF THE INVENTION

In some embodiments of the present invention, a device isolation structure of semiconductor device includes a semiconductor substrate having a cell region, a low voltage region and a high voltage region defined therein. A cell trench isolation region is disposed in the cell region. A low voltage trench isolation region is disposed in the low voltage region and extends deeper into the substrate than the cell trench isolation region. A first high voltage trench isolation region is disposed in the high voltage region and extends deeper into the substrate than the low voltage trench isolation region. A second high voltage trench isolation region is disposed in the high voltage region and extends deeper into the substrate than the low voltage trench isolation region but shallower than the first high voltage trench isolation region. The cell trench isolation region may have a minimum width that is less than a minimum width of the low voltage trench isolation region, and the minimum width of the low voltage trench isolation region may be less than a minimum width of the first high voltage trench isolation region. The minimum width of the first high voltage trench isolation region may be greater than a minimum width of the second high voltage trench isolation region.

In further embodiments, the first high voltage trench isolation region may have a step including a first bottom surface and a second bottom surface deeper in the substrate than the first bottom surface. The first bottom surface of the first high voltage trench isolation region may be at substantially the same depth in the substrate as a bottom surface of the second high voltage trench isolation region. The first bottom surface of the first high voltage trench isolation layer may be at substantially the same depth in the substrate as a bottom surface of the cell trench isolation region. A width of the first high voltage trench isolation region may decrease below the first bottom surface.

Additional embodiments of the present invention provide methods of forming a trench isolation structure in a semiconductor device. A cell region, a low voltage region and a high voltage region are defined in a semiconductor substrate. The semiconductor substrate is etched in the high voltage region to form a recess. Portions of the substrate in the low voltage region and the recess are simultaneously etched to form a low voltage trench in the low voltage region and a high voltage trench deeper than the low voltage trench in the high voltage region. Portions of the substrate in the cell region, the low voltage trench region and the high voltage trench are simultaneously etched to form a cell trench in the cell region and to deepen the low voltage trench in the low voltage region and the high voltage trench in the high voltage region. The cell trench, the low voltage trench and the high voltage trench are filled with insulating material to form a trench isolation structure including a cell trench isolation region in the cell region, a low voltage trench isolation region in the low voltage region, and a high voltage trench isolation region in the high voltage region.

In further embodiments, simultaneously etching portions of the low voltage region and the recess to form a low voltage trench in the low voltage region and a high voltage trench deeper than the low voltage trench in the high voltage region includes etching the recess and a portion of the substrate around the recess to form a step in the high voltage trench. Simultaneously etching portions of the cell region, the low voltage trench region and the high voltage trench to form a cell trench in the cell region and to deepen the low voltage trench in the low voltage region and the high voltage trench in the high voltage region may include etching the high voltage trench and a portion of the substrate around the high voltage trench to deepen the high-voltage trench and form a step in the high voltage trench.

Etching the semiconductor substrate in the high voltage region to form a recess may include forming a mask layer on the substrate, patterning the mask layer to form a mask pattern that exposes a portion of the substrate in the cell region and a portion of the substrate in the high voltage region, forming a resist pattern that covers the exposed portion of the substrate in the cell region and that exposes a portion of the mask pattern in the low voltage trench region and a portion of the substrate in the high voltage region, and etching exposed portions of the mask pattern and the substrate using the resist pattern as an etch mask to expose a portion of the substrate in the low voltage region and to form the recess. The method may further include etching portions of the substrate in the low voltage region and the high voltage region after forming the recess to form the low voltage trench region and the high voltage trench. The resist pattern may further expose a portion of the mask pattern around the exposed substrate in the high voltage region, and etching exposed portions of the mask pattern using the resist pattern as an etch mask to expose a portion of the substrate in the low voltage region and to form the recess may include etching the mask pattern to expose a portion of the semiconductor substrate around the recess.

The method may further include removing the resist pattern to expose the mask pattern and portions of the semiconductor substrate and etching exposed portions of the semiconductor substrate in the cell region, the low voltage region and the high voltage region using the mask pattern as an etch mask to form a cell trench in the cell region, and to deepen the low voltage trench and the high voltage trench. Forming a resist pattern that exposes a portion of the mask pattern in the low voltage trench region and a portion of the substrate in the high voltage region may include forming a resist pattern that exposes a portion of the mask pattern in the low voltage trench region and a portion of the substrate in the high voltage region and that includes a portion that overlaps a sidewall of the mask pattern adjacent the exposed portion of the substrate in the high voltage region and wherein etching exposed portions of the mask pattern and the substrate using the resist pattern as an etch mask to expose a portion of the substrate in the low voltage region and to form the recess includes forming the recess adjacent the portion of the resist pattern that overlaps the sidewall of the mask layer.

In additional method embodiments, trench isolation structures are formed. A cell region, a low voltage region and a high voltage region are defined in a semiconductor substrate. A gate insulating layer is formed on the cell region, the low voltage region and the high voltage region. The gate insulating layer in the high voltage region is thicker than the gate insulation layer in the low voltage region. A mask layer is formed on the gate insulating layer and the mask layer and the gate insulating layer are patterned to form a mask pattern that exposes portions of the substrate in the cell region and the high voltage region. A resist pattern is formed that covers the exposed portion of the substrate in the cell region and exposes a portion of the mask layer in the low voltage region and a portion of the substrate in the high voltage region. Exposed portions of the mask pattern and the substrate are etched using the resist pattern as an etch mask to form a recess in the high voltage region and to expose portion of the substrate in the low voltage region. The resist pattern is removed to expose a portion of the substrate in the cell region. Exposed portions of the substrate in the cell region, the low voltage region and the high voltage region are etched to form a cell trench in the cell region, a low voltage trench deeper than the cell trench in the low voltage region, a first high voltage trench deeper than the low voltage trench and a second high voltage trench in the high voltage region that is deeper than the low voltage trench and shallower than the first high voltage trench. Insulating regions are formed in the cell trench, the low voltage trench and the first and second high voltage trenches.

In further method embodiments, a trench isolation structure of a semiconductor device is formed by defining a cell region, a low voltage region and a high voltage region in a semiconductor substrate and forming a gate insulating layer on the cell region, the low voltage region and the high voltage region. The gate insulating layer formed on the high voltage region is thicker than on the low voltage region. A mask layer is formed on the gate insulating layer, and the mask layer and the gate insulating layer are patterned to form a mask pattern that exposes portions of the substrate in the cell region and the high voltage region. A resist pattern is formed that covers the portion of the substrate exposed in the cell region, that exposes portions of the mask layer in the low voltage region and the high voltage region, and that exposes a portion of the substrate in the high voltage region and a portion of the mask layer around the exposed portion of the substrate. Exposed portions of the mask pattern and the substrate are etched using the resist pattern as an etch mask to form a recess in the high voltage region and to expose portions of the substrate in the high voltage region and the low voltage region. Exposed portions of the substrate in the high voltage region, the low voltage region and the recess are etched using the resist pattern as an etch mask to form a first high voltage trench in the recess, a second high voltage trench in the high voltage region and a low voltage trench in the low voltage region. The resist pattern is removed to expose a portion of the substrate in the cell region. Exposed portions of the substrate in the cell region, the high voltage region and the low voltage region are etched to form a cell trench in the cell region and to deepen the low voltage trench, the first high voltage trench and the second high voltage trench, such that the low voltage trench is deeper than the cell trench, the second high voltage trench is deeper that the low voltage trench, and the first low voltage trench is deeper than the second high voltage trench. Insulating regions are formed in the cell trench, the low voltage trench and the first and second high voltage trenches.

In further method embodiments, a trench isolation structure of a semiconductor device is formed by defining a cell region, a low voltage region and a high voltage region in a semiconductor substrate and forming a gate insulating layer in the cell region, the low voltage region and the high voltage region, the gate insulating layer on the high voltage region thicker than on the low voltage region. A mask layer is formed on the gate insulating layer, and the mask layer and the gate insulating layer are patterned to form a mask pattern that exposes portions of the substrate in the cell region and the high voltage region. A resist pattern is formed that covers the exposed portion of the substrate in the cell region, that partially covers the exposed portion of the substrate in the high voltage region and that exposes portions of the mask pattern in the low voltage region and the high voltage region. Exposed portions of the substrate and the mask region are etched using the resist pattern as an etch mask to form a recess in the high voltage region and to expose portions of the substrate in the high voltage region and the low voltage region. Exposed portions of the substrate in the high voltage region, the low voltage region and the recess are etched using the resist pattern as an etch mask to form a low voltage trench in the low voltage region, a first high voltage trench at the recess and a second high voltage trench in the high voltage region. The resist pattern is removed to expose a portion of the substrate in the cell region and a portion of the substrate around the high voltage trench. The exposed portions of the substrate in the cell trench, the low voltage trench and the first and second high voltage trenches are etched to form a cell trench in the cell region and to deepen the low voltage trench and the first and second high voltage trenches such that the low voltage trench is deeper than the cell trench, the second high voltage trench is deeper than the low voltage trench, and the first high voltage trench is deeper than the second high voltage trench. Insulating regions are formed in the cell trench, the low voltage trench and the first and second high voltage trenches.

Some embodiments of the invention may provide a device isolation structure that is sufficiently filled with an insulation layer at a high density pattern region while having superior isolation ability where high operation voltage is supplied.

Thus, in some embodiments, the present invention may provide a device isolation structure with trench isolation regions having different depths in accordance with a pattern density. The structure may include a cell trench isolation layer, a low voltage trench isolation region, and first and second high voltage trench isolation region formed on a semiconductor substrate where a cell region, a low voltage region and a high voltage region are defined. The cell trench isolation region is formed on the cell region, and the low voltage trench isolation region is deeper than the cell trench isolation region. The first high voltage trench isolation region deeper than the low voltage trench isolation region is formed on the high voltage region. And the second high voltage trench isolation region deeper than the low voltage trench isolation region and shallower than the first high voltage trench isolation region is formed on the high voltage device region.

The present invention also provides a method for forming a device isolation structure having a depth different in accordance with a pattern density. The device isolation structure is included in a semiconductor device having a cell region, a low voltage region and a high voltage region. The method includes forming a recess region on a part of a semiconductor substrate and simultaneously etching the recess region and a semiconductor substrate at other portions to form trench regions with different depths. Then, a semiconductor substrate at other portions and the trench regions are simultaneously etched.

More concretely, a method according to some embodiments of the present invention, includes defining a cell region, a low voltage region and a high voltage region on a semiconductor substrate. The semiconductor substrate in the high voltage region is etched with a predetermined depth to form a recess. A part of the low voltage region and the recess is etched to form a low voltage trench region in the low voltage region, and a high voltage trench region deeper than the low voltage trench region in the high voltage region. A part of the cell region, the low voltage trench region and the high voltage trench region is etched to form a cell trench in the cell region, a low voltage trench in the low voltage region and a high voltage trench in the high voltage region. The cell trench, the low voltage trench and the high voltage trench are filled with an insulation film to form device isolation layers.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

Figure 1:
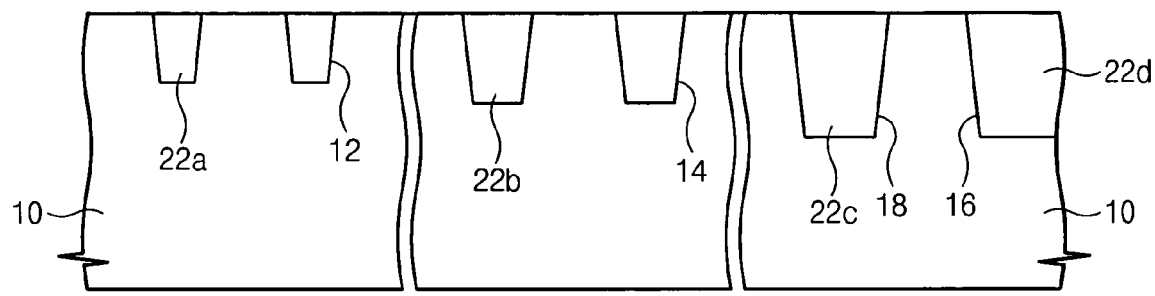
FIGS. 1 and 2 are cross-sectional views of a semiconductor device having a trench isolation structure in accordance with the prior art.
Figure 2:
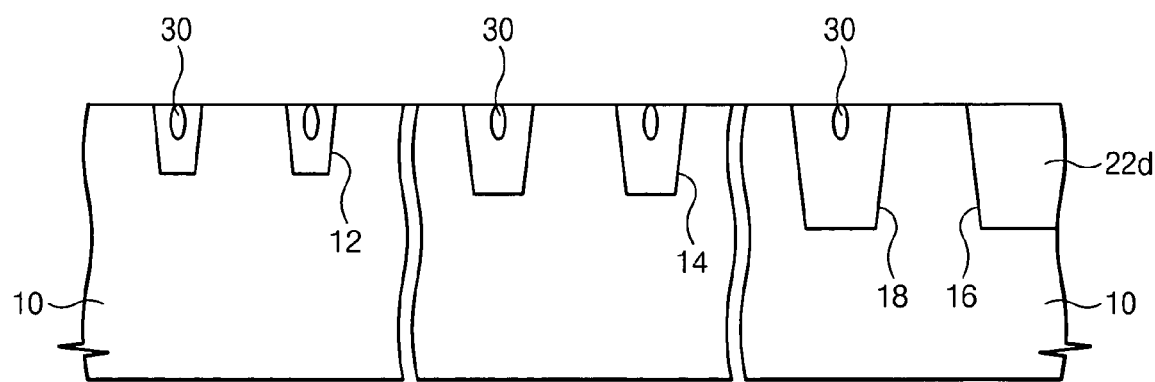

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 3:
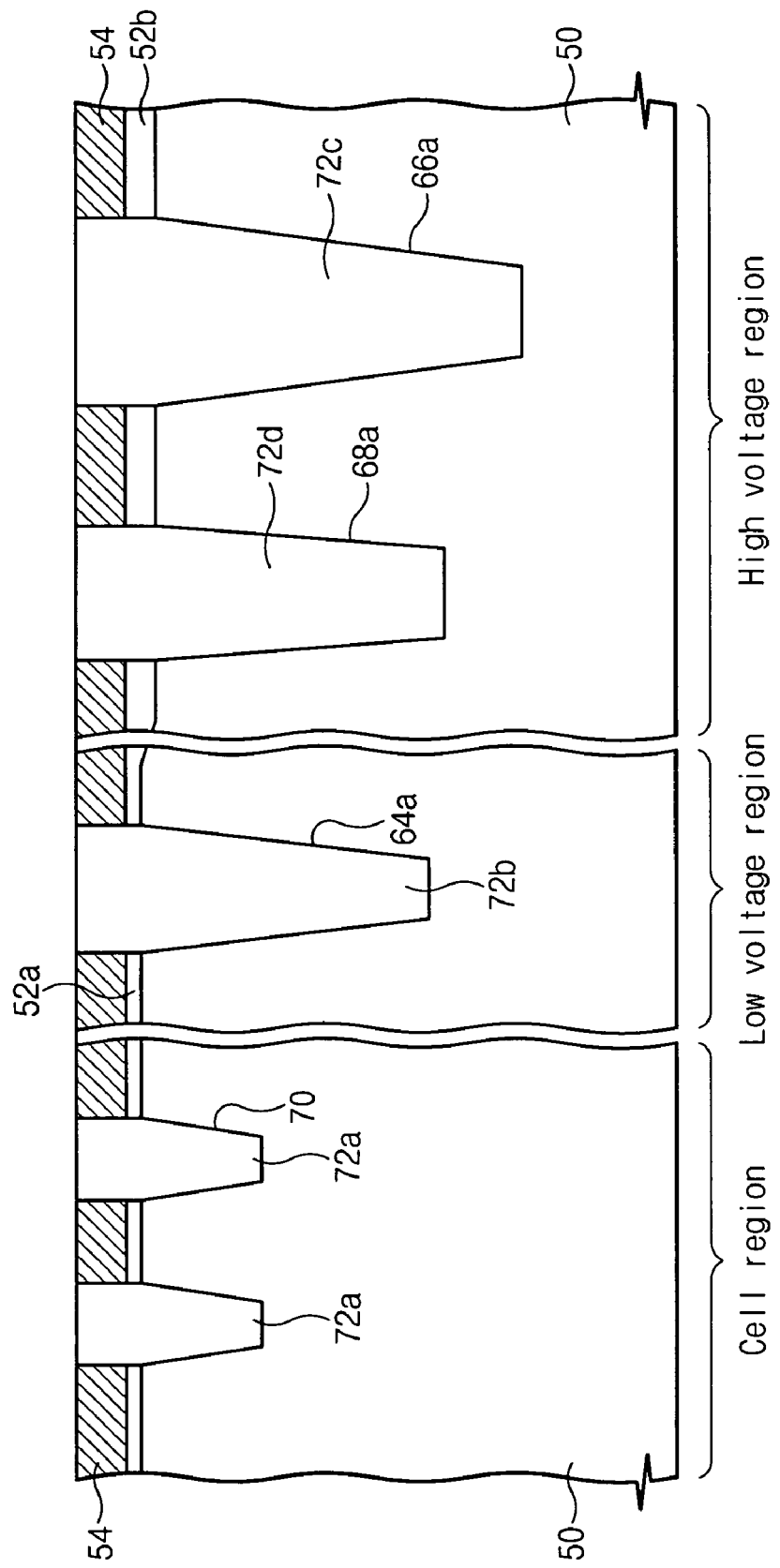
FIG. 3 is a cross-sectional view illustrating a device isolation structure of a semiconductor device in accordance with first embodiments of the present invention.

FIG. 3 is a cross-sectional view illustrating a semiconductor device having a device isolation structure in accordance with first embodiments of the present invention. Referring to FIG. 3, a cell region, and a peripheral region including a low voltage region and a high voltage region are defined on a semiconductor substrate 50. A plurality of trenches are formed on the semiconductor substrate. The trenches are filled with an insulation layer to form a device isolation layer.

A cell trench 70 and a low voltage trench 64a are formed in the cell region and the low voltage region, respectively, and a first high voltage trench 66a and the second high voltage trench 68a are formed in the high voltage region. The low voltage trench 64a is deeper than the cell trench 70. The first high voltage trench 66a is wider and deeper than the low voltage trench 64a. The second high voltage trench 68a is shallower than the first high voltage trench 66a, and deeper than the low voltage trench 64a. In addition, the second high voltage trench 68a is narrower than the first high voltage trench 66a.

The device isolation structure includes a cell trench isolation layer (region) 72a and a low voltage trench isolation layer 72b formed in the cell trench 70 and the low voltage trench 64a, respectively. A first high voltage trench isolation layer 72c and a second high voltage trench isolation layer 72d are formed in the first high voltage trench 66a and the second high voltage trench 68a.

It is preferable that an area of a device isolation layer is small in a cell region in order to maximize an amount of the stored information. Accordingly, a width of a device isolation layer in a cell region may be relatively less than a width of a device isolation layer in a peripheral circuit region. In some embodiments of the present invention, therefore, the cell trench isolation layer 72a may be narrower than the device isolation layers in other regions. The cell trench 70 has a relatively shallow depth so that an aspect ratio of the trench is limited to allow complete filling with an insulating layer. However, the low voltage trench isolation layer 72b with a relatively greater width is formed deeper than the cell trench isolation layer 72a, and a depth of the first high voltage trench isolation layer 72c for electrically isolating the neighboring device at a high operational voltage is greater than the low voltage trench isolation layer 72b. In general, a width of the device isolation layer formed in the high voltage region is the same as the width of the first high voltage trench isolation layer 72c, but may have a narrow width like a second high voltage trench isolation layer 72d depending on regions. In some embodiments of the present invention, a second high voltage trench isolation layer 72d with a relatively narrow width is deeper than the low voltage trench isolation layer 72b and shallower than the first high voltage trench isolation layer 72c.

The device isolation layers define active regions in the cell region, the low voltage region and the high voltage region, respectively. A gate insulating layer is formed on the active region. A gate insulating layer 52b formed in the high voltage region is thicker than a gate insulating layer 52a formed in the low voltage region. A difference in depth between the low voltage trench isolation layer 72b and the first high voltage trench isolation layer 72c may be generated due to a difference in the thicknesses. A mask pattern 54 formed on the gate insulating layer may be a sacrificial layer removed after the device isolation structure is completed, and a conductive layer may be configured to form a gate electrode formed on the active region.

Figure 4:
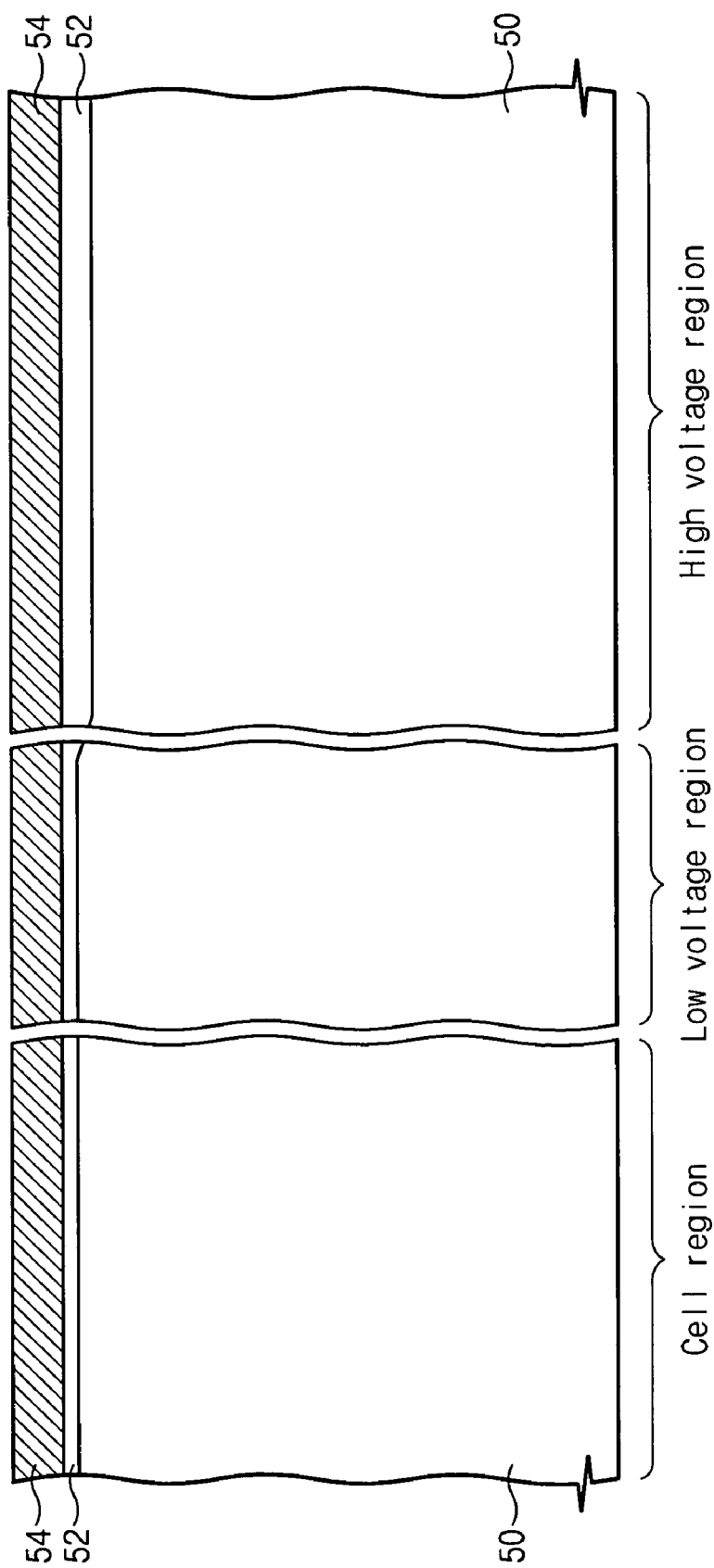
FIGS. 4 to 9 are cross-sectional views illustrating operations for forming a device isolation structure of a semiconductor device in accordance with the first embodiments of the present invention.

FIGS. 4 to 9 are cross-sectional views describing operations for forming a device isolation structure in accordance with the first embodiments of the present invention. Referring to FIG. 4, a gate insulating layer 52 is formed on a semiconductor substrate 50, and a mask layer 54 is formed on the gate insulating layer 52. The gate insulating layer 52 may have different kinds of materials and/or thicknesses in a cell region, a low voltage region and a high voltage region. For example, as shown in FIG. 4, a thicker insulating layer may be formed in the high voltage region in comparison with the low voltage region. The gate insulating layer formed in the cell region may use a structure or a material in accordance with type of kind of semiconductor device. For example, in a flash memory device, a gate insulating layer in a cell region may have a thickness that enables charge tunneling. In a charge trap-type memory device such as a SONOS, a gate insulating layer in the cell region may be a multilayer insulating layer including a charge storage layer.

The mask layer 54 may be a sacrificial layer used as an etch stop layer in etching a substrate and/or may include a conductive layer used to form a gate electrode. If the mask layer 54 includes a conductive layer for forming a gate electrode, an etch stop layer may be further formed on the conductive layer. If the mask layer 54 is simply a sacrificial layer, the gate insulating layer may be replaced with a buffer insulating layer, and a gate insulating layer may be formed after the device isolation structure in accordance after forming of device isolation regions.

Figure 5:
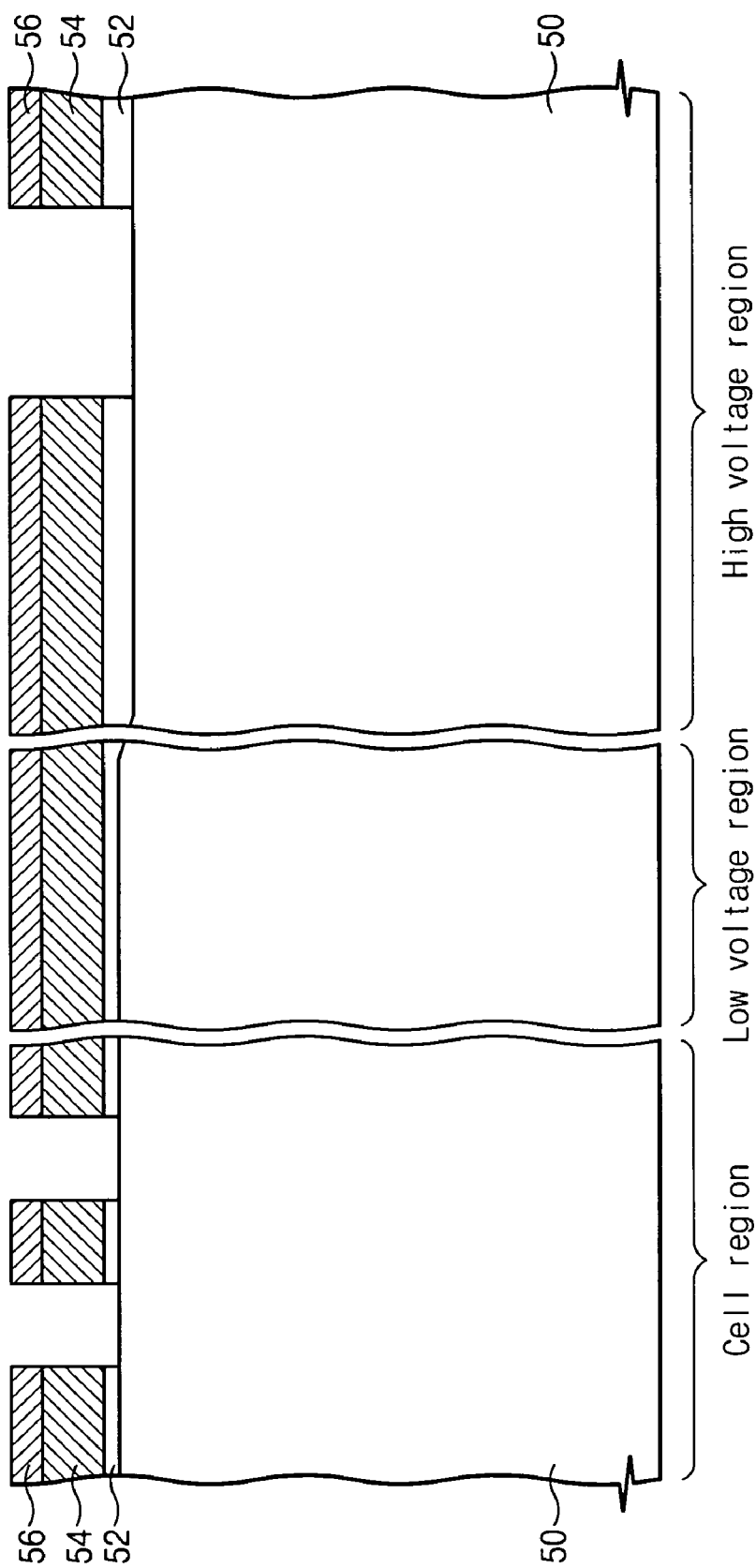

Referring to FIG. 5, the first resist layer 56 is formed on the mask layer 54 and patterned to expose a part of the cell region and the high voltage region. The mask layer 54 is etched using the first resist layer 56 as an etch mask layer to expose a part of a substrate in the cell region and a part of a substrate in the high voltage region. The openings through the first resist layer 56 correspond to a region where a cell trench is formed and region where a high voltage trench is formed.

Figure 6:
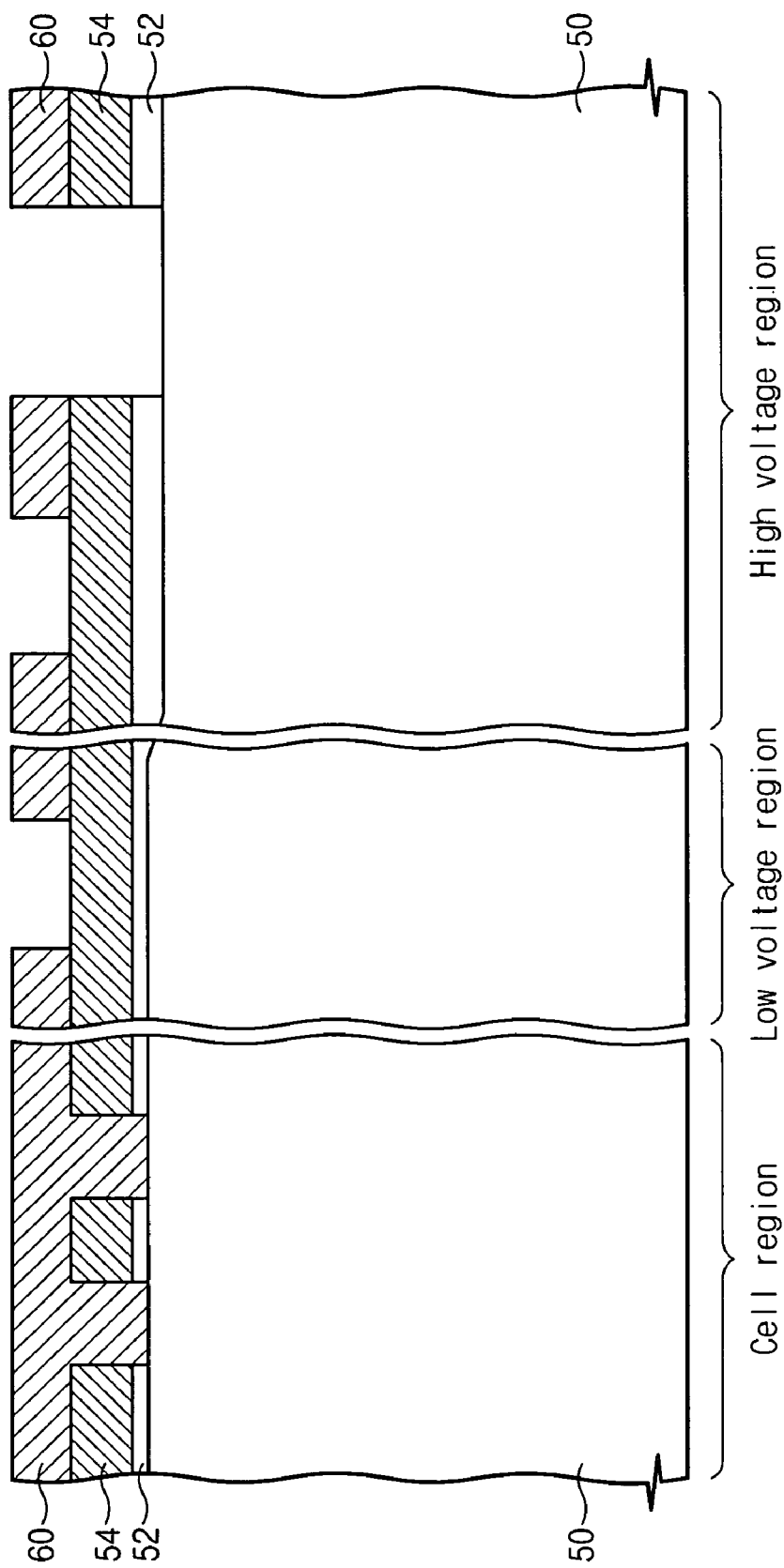

Referring to FIG. 6, the first resist layer 56 is removed, and a second resist layer 60 is formed on the substrate and patterned to expose a part of the low voltage region and a part of the high voltage region. The second resist layer 60 covers a portion of the substrate exposed in the cell region. The openings in the second resist layer 60 correspond to a region where a low voltage trench is formed and a region where the first and the second high voltage trenches are formed. In other words, a part of the high voltage region exposed to a corresponding opening of the first resist layer 56 is exposed by a corresponding opening of the second resist layer 60.

Figure 7:
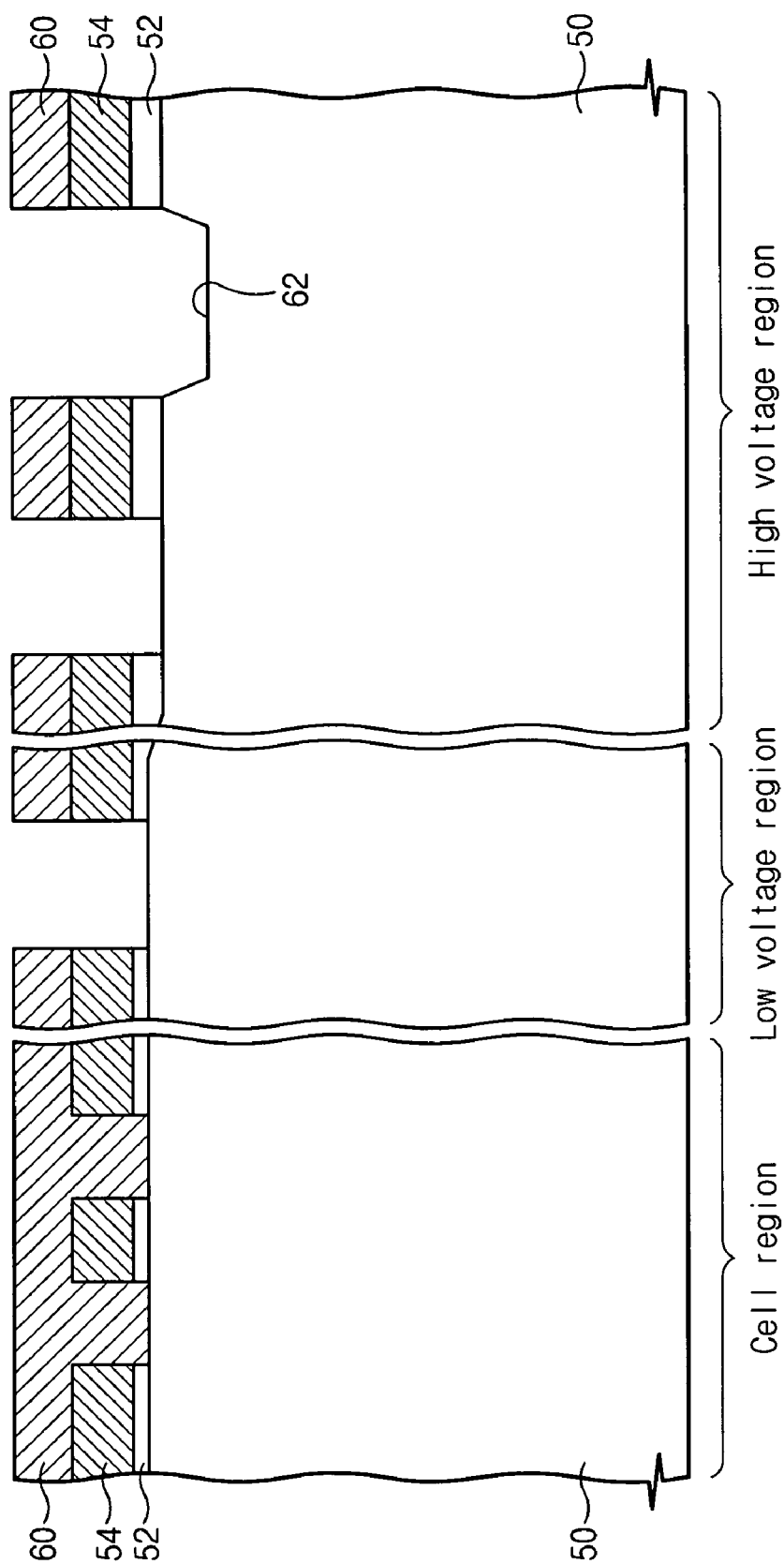

Referring to FIG. 7, the mask layer 54 and the gate insulating layer 52 are etched using the second resist layer 60 as an etch mask. A portion of the substrate exposed in the high voltage region is etched to form a recess 62. The mask layer 54 is etched using an etch process having a high etch rate for the semiconductor substrate and the mask layer.

Figure 8:
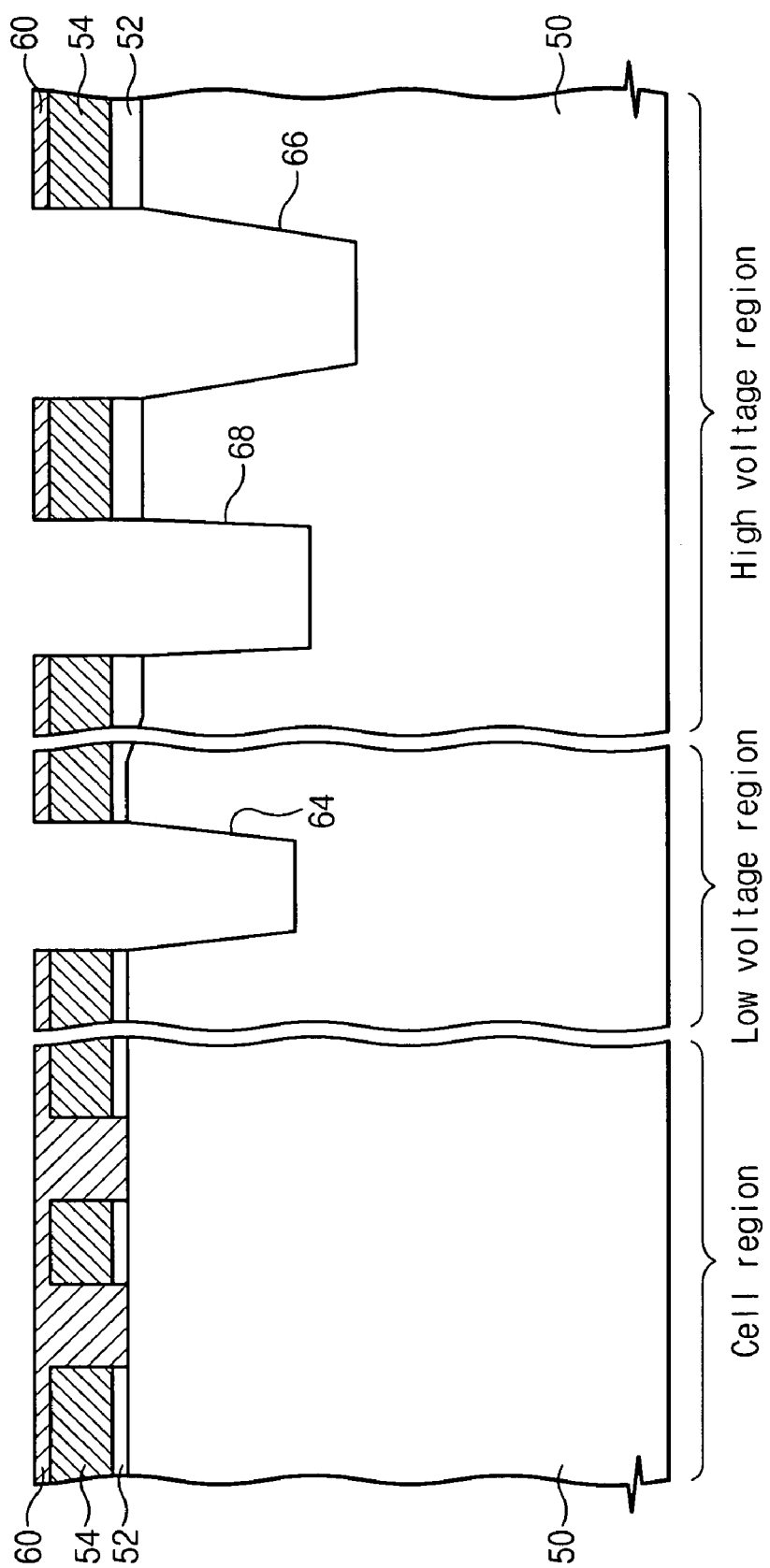

Referring to FIG. 8, portions of the substrate exposed in the low voltage region and the high voltage region are etched using the second resist layer 60 as an etch mask. The recess 62 is etched while the semiconductor substrate at other regions is etched. As a result, a low voltage trench region 64 is formed in the low voltage region, and a first high voltage trench 66 and a second high voltage trench 68 are formed in the high voltage region. The first high voltage trench 66 is additionally etched with respect to the recess 62 of FIG. 7. Accordingly, the first high voltage trench 66 is relatively deep in comparison to the first low voltage trench 64 and the second high voltage trench 68. If a gate insulating layer is formed to have different thicknesses in the high voltage region and a low voltage region, the first high voltage trench 66 is deeper than the low voltage trench region 64. However, if the gate insulating layer is formed to have the same thickness in the high voltage region and the low voltage region, the first high voltage trench 66 may not be deeper than the low voltage trench 64.

Figure 9:
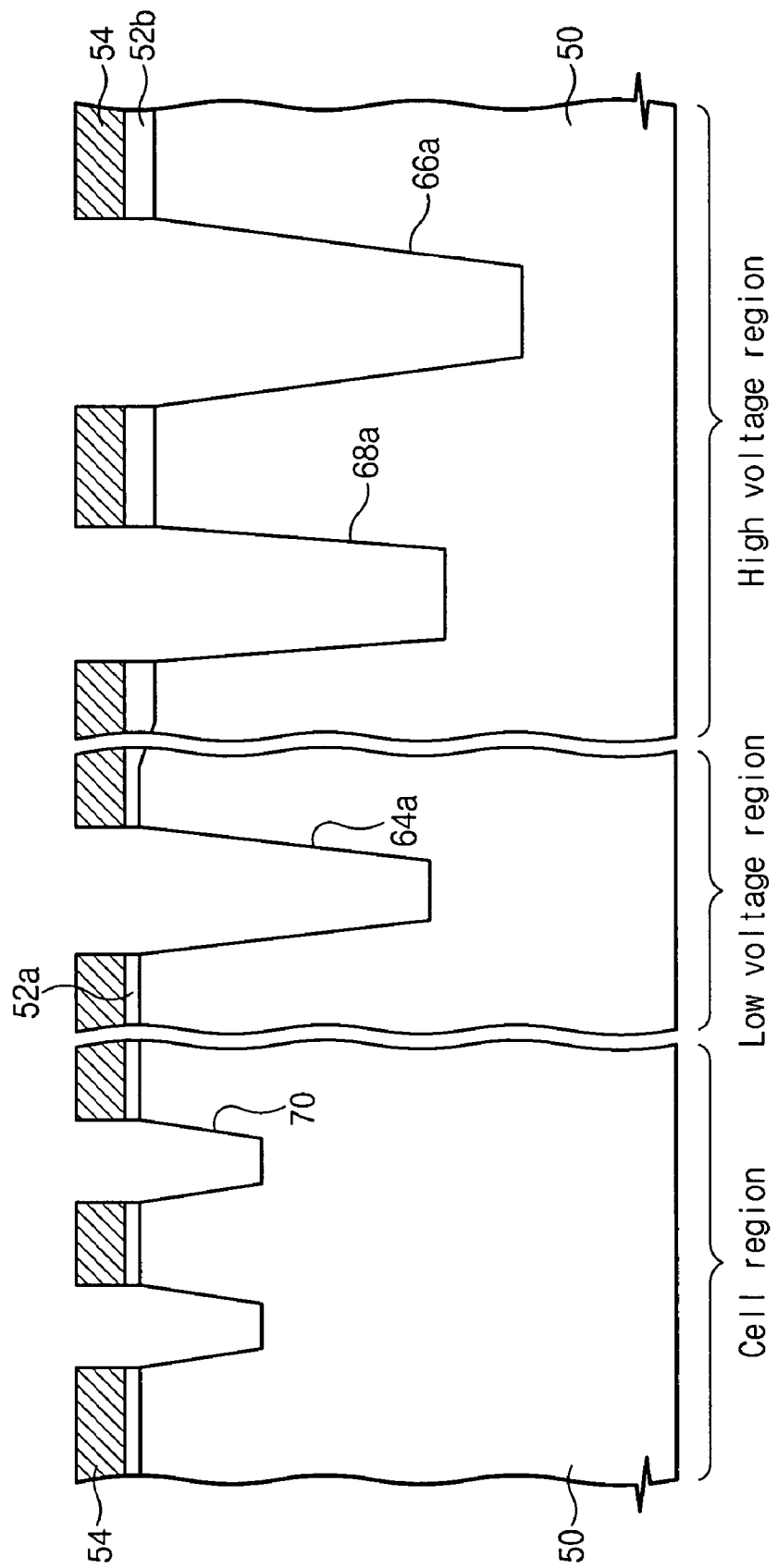

Referring to FIG. 9, the second resist layer 60 is removed, and an exposed substrate is etched using the mask layer 54 as an etch mask to form a cell trench 70 in the cell region. Exposed portions of the substrate exposed in the low voltage region and the high voltage region are etched to form a low voltage trench 64a in the low voltage region and a first high voltage trench 66a and a second high voltage trench 68a in the high voltage region. No additional mask processes are required to for the cell trench 70 in the cell region. Accordingly, various trenches may be formed with a number of mask processes less than the number of depths of the trenches.

The cell trench 70, the low voltage trench 64A and the first and the second high voltage trenches 66A and 68A are filled with an insulating layer to form a device isolation structure. The mask layer 54 and the gate insulating layer 54 are removed after the device isolation structure is formed, and a process for forming a gate may proceed after a gate insulating layer is formed. If the mask layer 54 includes a material for forming a gate electrode, the gate insulating layer formed on the low voltage region becomes a low voltage gate insulating layer 52a, and the gate insulating layer formed on the high voltage region becomes a high voltage gate insulating layer 52b.

In accordance with the above described embodiments, one trench isolation layer has a single bottom structure. However, in further embodiments, a trench isolation layer may have a stepped bottom structure.

Figure 10:
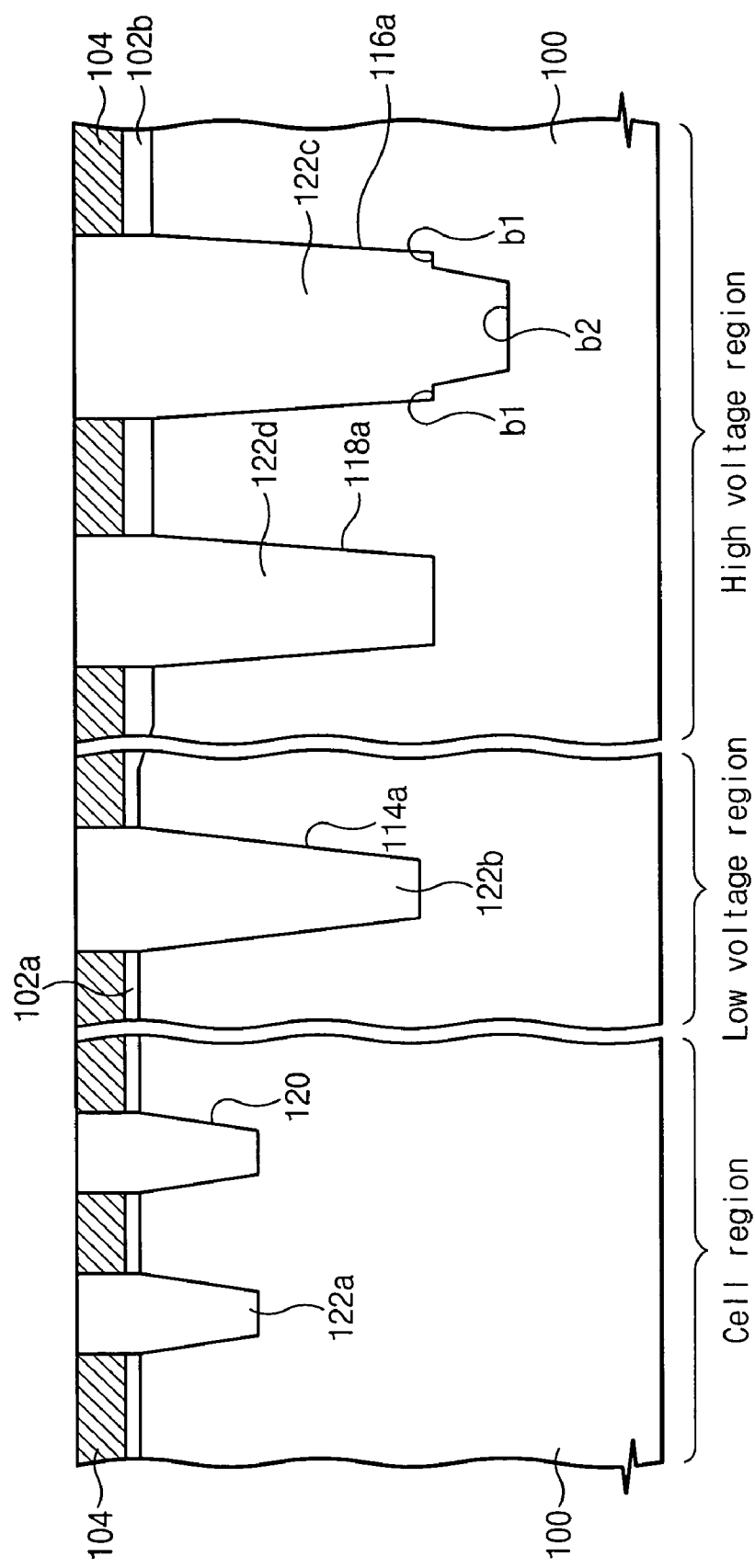
FIG. 10 is a cross-sectional view illustrating a device isolation structure of a semiconductor device in accordance with second embodiments of the present invention.

FIG. 10 is a cross-sectional view illustrating a device isolation structure in accordance with second embodiments of the present invention. Referring to FIG. 10, a cell trench 120, a low voltage trench 114a, a first high voltage trench 116a and a second voltage trench 118a are formed on a semiconductor substrate on which a cell region, a low voltage region and a high voltage region are defined. A cell trench isolation layer 122a, a low voltage trench isolation layer 122b, a first high voltage trench isolation layer 122c and a second high voltage trench isolation layer 122d are formed in the cell trench 120, the low voltage trench 114a, the first high voltage trench 116a and the second high voltage trench 118a, respectively.

In the second embodiments, the first high voltage trench isolation layer 122c has a different structure than the corresponding structure in the first embodiments. In the first embodiments, the first high voltage trench isolation layer has a single bottom structure, unlike the stepped bottom structure of the first high voltage trench isolation layer 122c in the second embodiments. In other words, the first high voltage trench 116A has a bottom surface where a step is formed between a first bottom surface B1 and a second bottom surface B2 that is deeper than the first bottom surface B1. Accordingly, a step is formed at a bottom of the first high voltage trench isolation layer 122C formed in the first high voltage trench 116A. The first bottom B1 has a depth corresponding to the bottom of the second high voltage trench 118A. The first high voltage trench isolation layer 112C has a structure with a width that rapidly decreases. The gate insulating layer 102a and 102b and the mask layer 104 may be similar to those described for the first embodiments.

Figure 11:
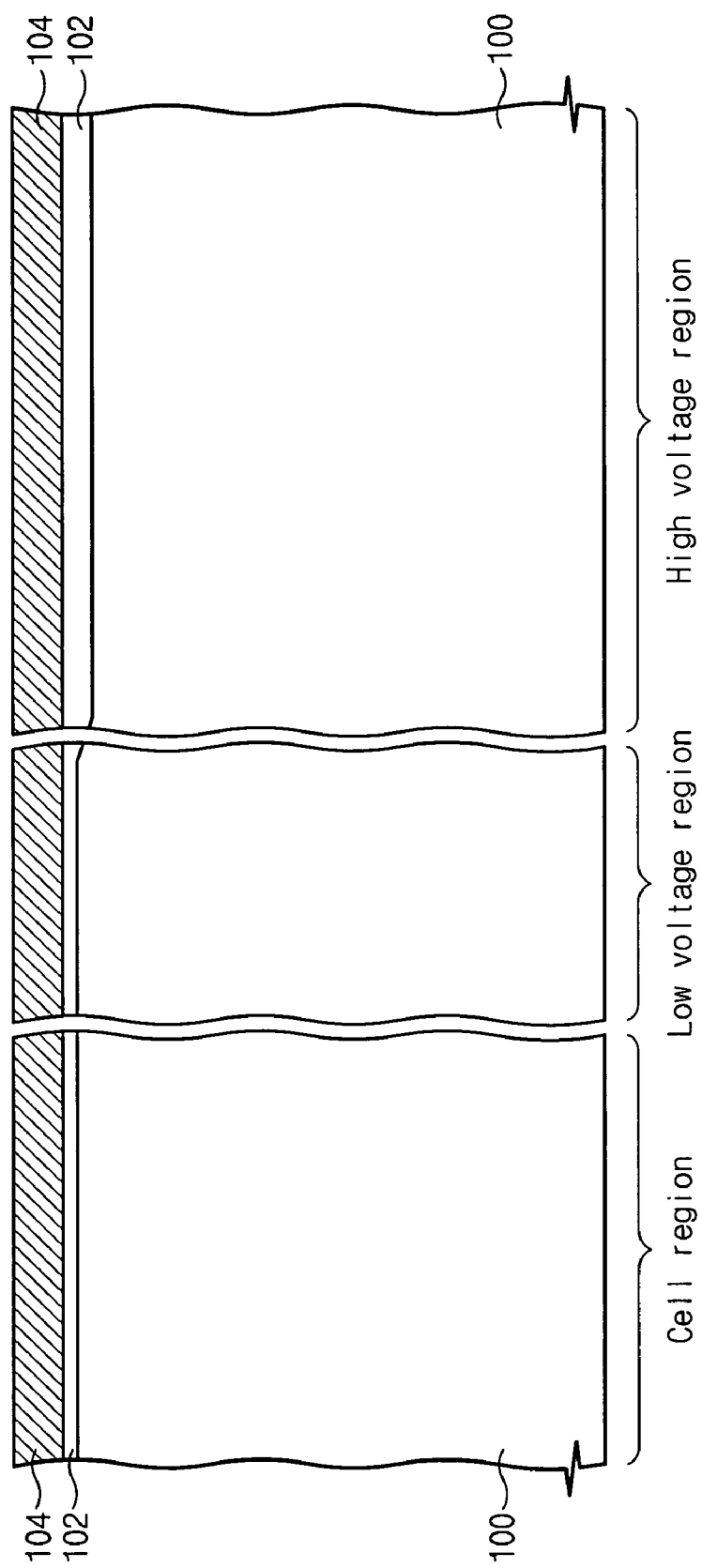
FIGS. 11 to 16 are cross-sectional views illustrating operations for forming a device isolation structure of a semiconductor device in accordance with the second embodiments of the present invention.

FIGS. 11 to 16 are cross-sectional views illustrating operations for forming a device isolation structure in accordance with the second embodiments. Referring to FIG. 11, a gate insulating layer 102 is formed on a semiconductor substrate 100, and a mask layer 104 is formed on the gate insulating layer. The gate insulating layer 102 may have different materials and thicknesses in a cell region, a low voltage region and a high voltage region. For example, a thicker gate insulating layer may be provided in the high voltage region than in the low voltage region. The gate insulating layer formed in the cell region may have a structure and a material in accordance with the kind of device formed in the cell region. For example, in a flash memory device, a gate insulating layer in the cell region may be thin to support charge tunneling, and in a charge-trap type memory, device such as a SONOS, the gate insulating layer in the cell region may be a multiple insulating layer including a charge storage layer.

The mask layer 104 also may include a conductive layer used to form a gate electrode. If the mask layer 104 includes a conductive layer for a gate electrode, an etch stop layer may be further formed on a conductive layer. If the mask layer 104 is simply sacrificial layer, the gate insulating layer may be replaced with a buffer insulating layer. After a device isolation structure is completed, a gate insulating layer may be formed.

Figure 12:
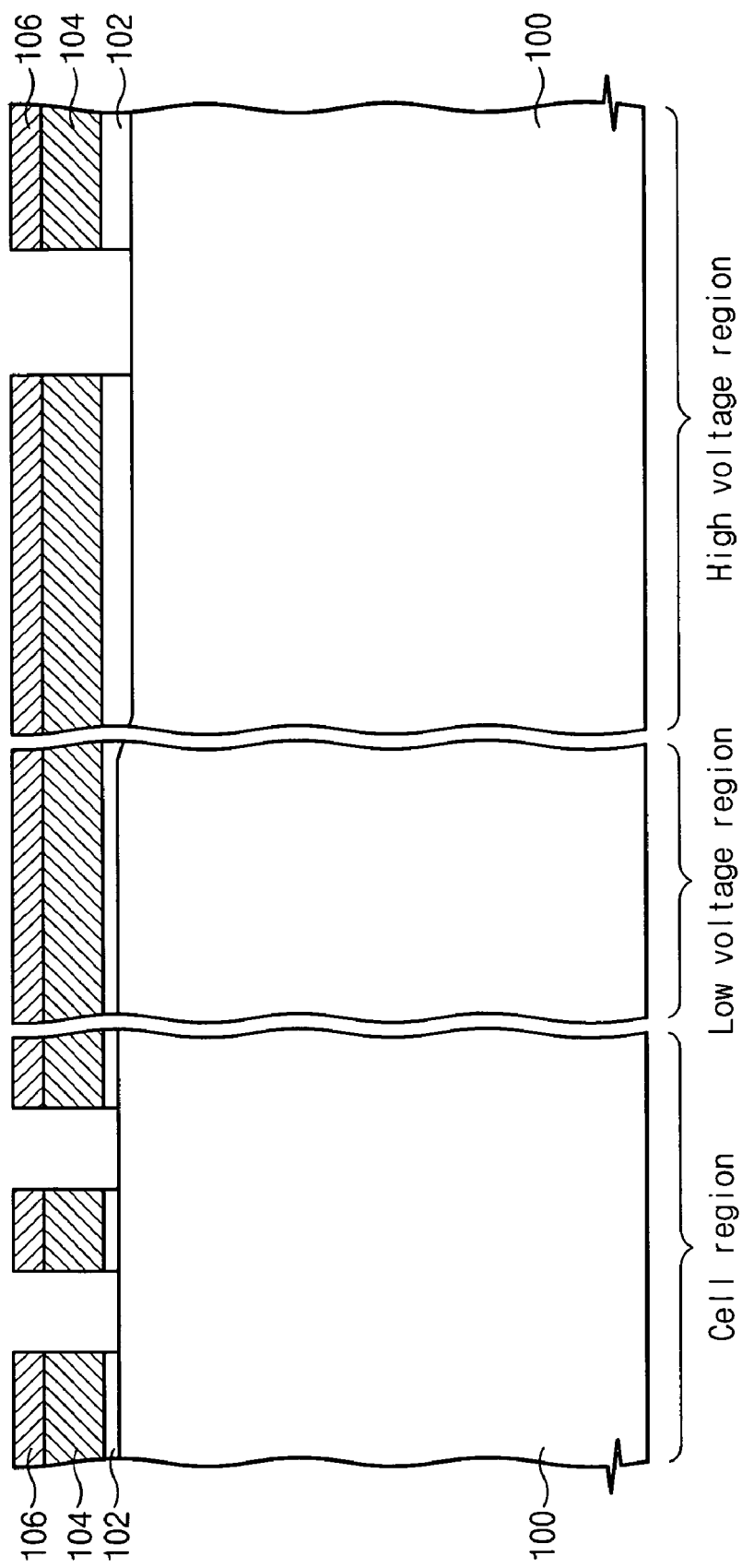

Referring to FIG. 12, a first resist layer 106 is formed on the mask layer 104 and patterned to expose a part of the cell region and a part of the high voltage region. The mask layer 104 is etched using the first resist layer 106 as an etch mask to expose a part of the cell region and a part of the high voltage region. The openings in the first resist layer 106 correspond to a region for a cell trench to be formed and a region for a high voltage trench to be formed.

Figure 13:
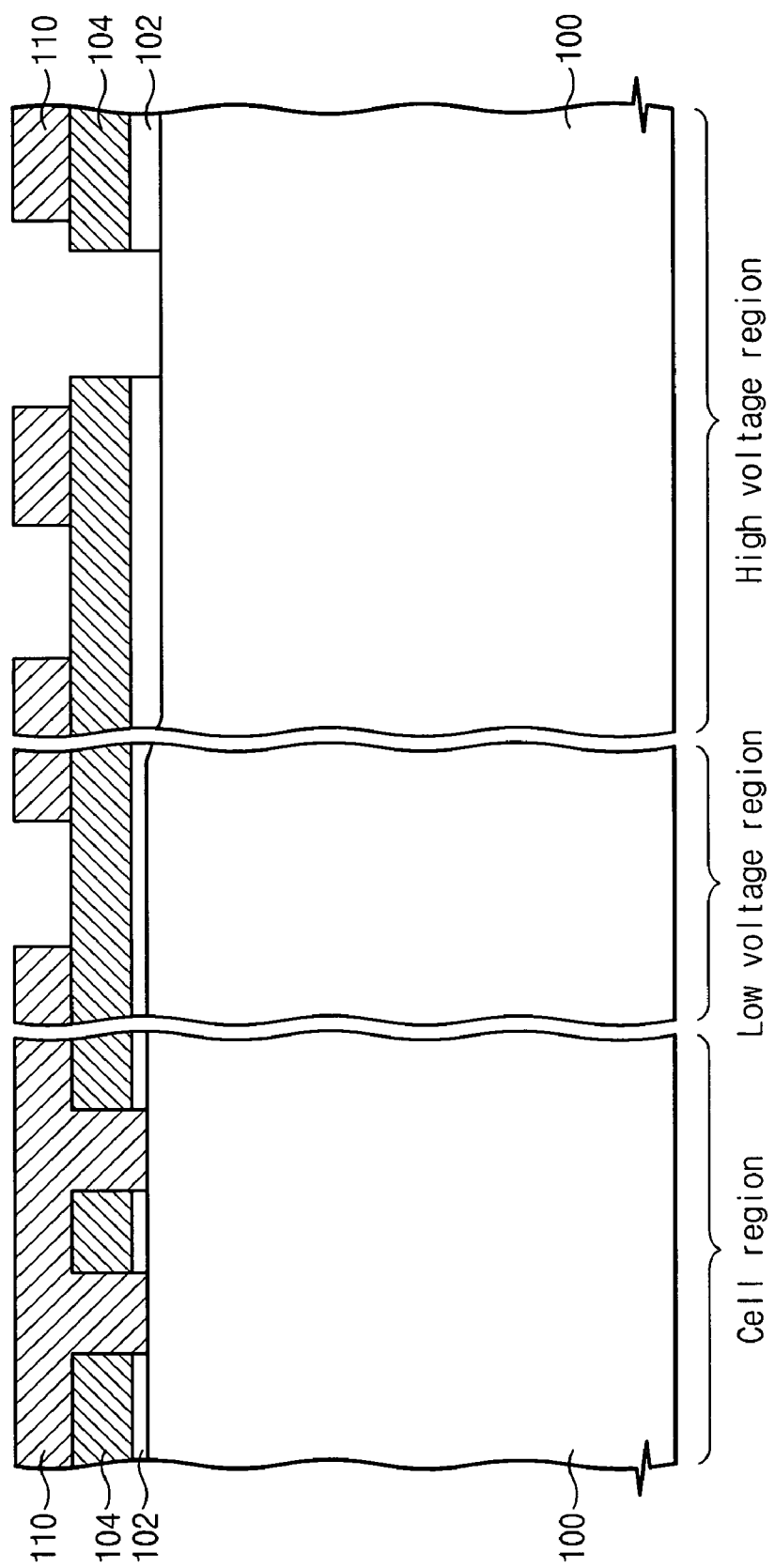

Referring to FIG. 13, the first resist layer 106 is removed. A second resist layer 110 is formed on the substrate and patterned to expose a part of the low voltage region and a part of the high voltage region. The second resist layer 110 covers a previously exposed portion of the substrate in the cell region. Openings in the second resist layer 110 correspond to a region where a low voltage trench is to be formed, and regions where first and second high voltage trenches are to be formed.

Figure 14:
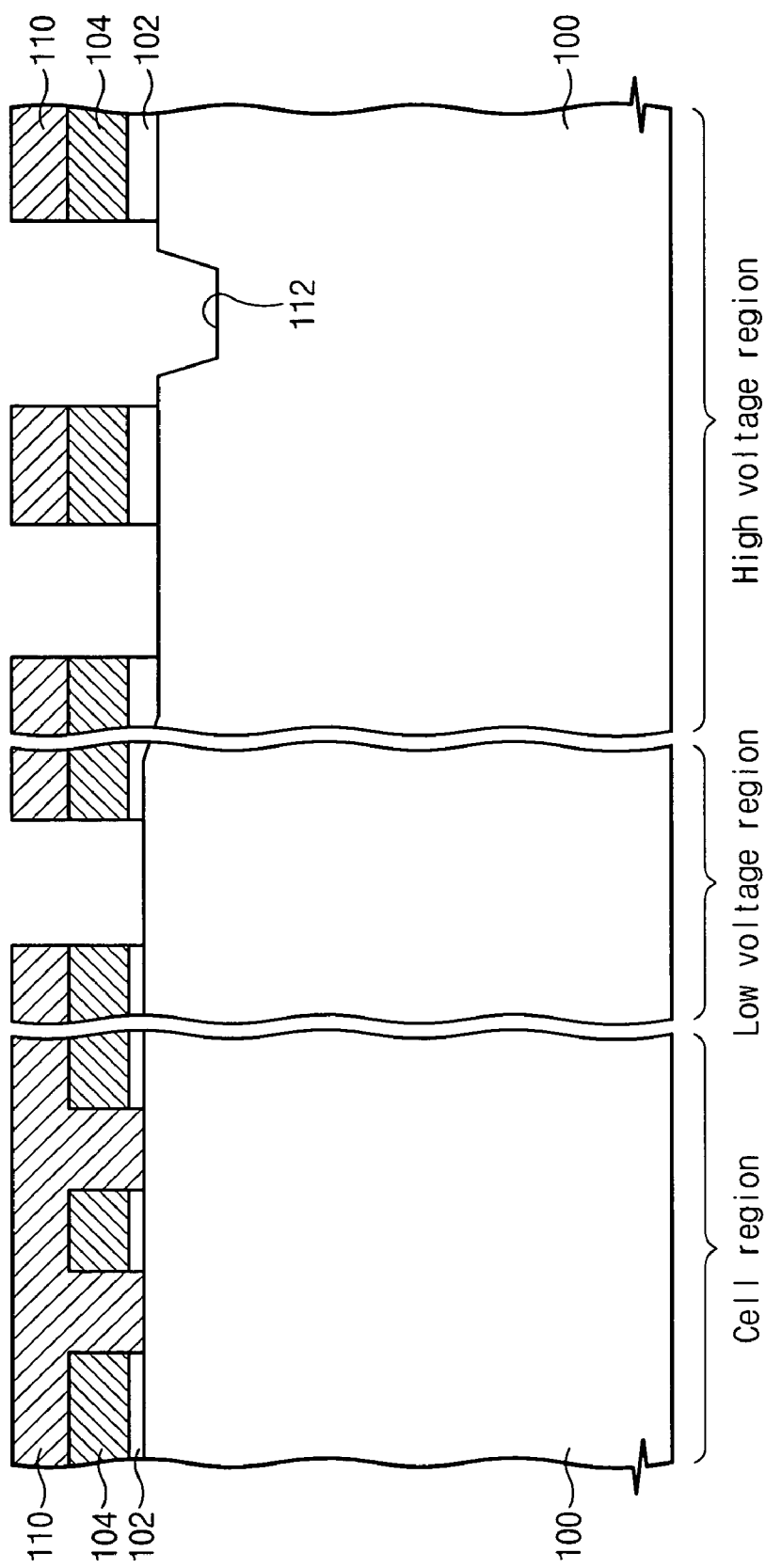

Referring to FIG. 14, the mask layer 104 and the gate insulating layer 102 are etched using the second resist layer 110 as an etch mask. The exposed portion of the substrate in the high voltage region is etched to form a recess 112. Portions of the mask layer 104 and the gate insulating layer 102 around the recess 112 are etched to expose portions of the substrate around the recess 112. The etching may involve use of an etch process having a high etch rate for the semiconductor substrate in comparison to the mask layer 104.

Figure 15:
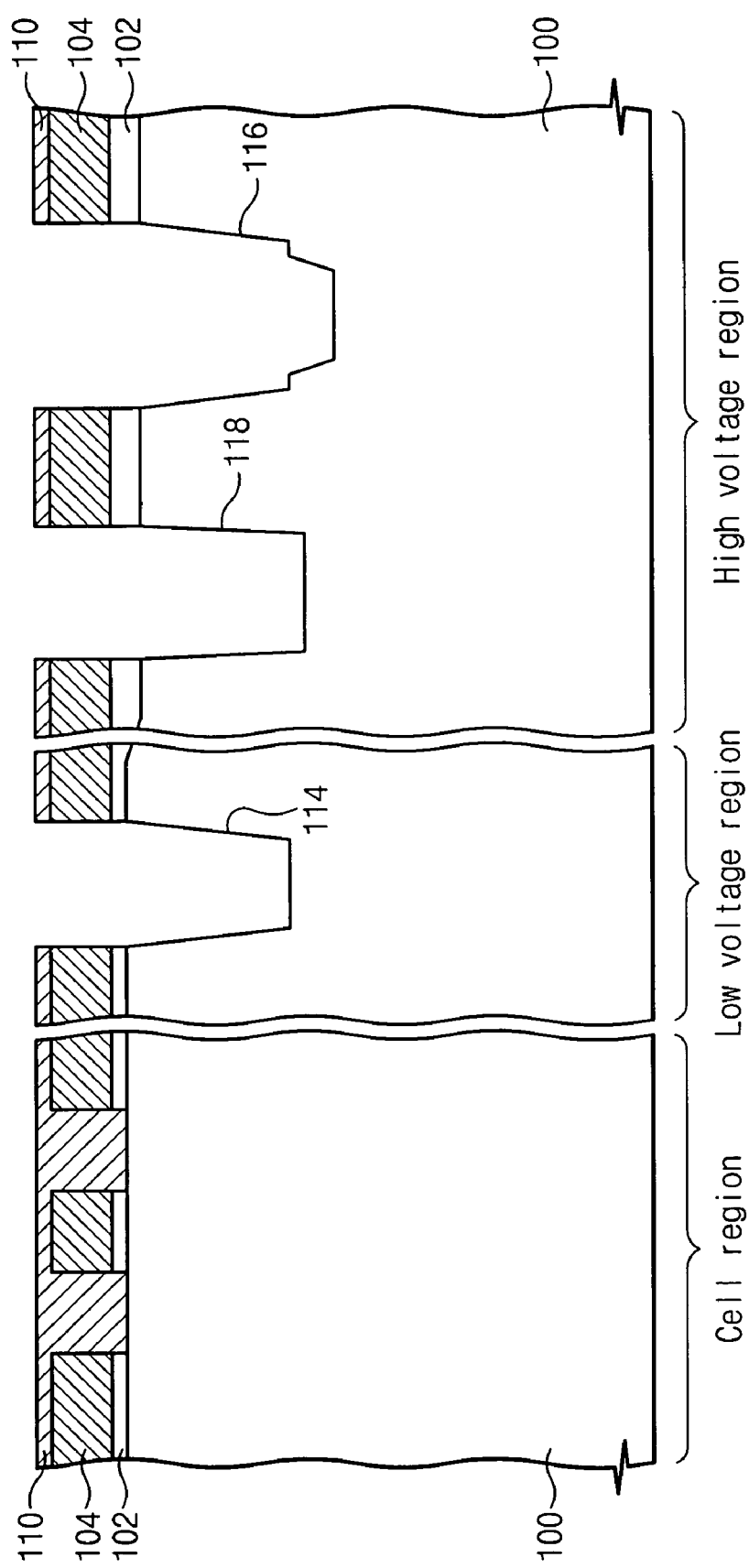

Referring to FIG. 15, portions of the substrate exposed in the low voltage region and the high voltage region are etched using the second resist layer 110 as an etch mask. The etching also produces a low voltage trench 114 in the low voltage region, and for and second high voltage trench region 116 and 118 in the high voltage region. The first high voltage trench region 116 is formed by additionally etching the recess 112. Accordingly, the first high voltage trench 116 is relatively deeper than the low voltage trench region 114 and the second high voltage trench region 116. The first high voltage trench 116 may be irradiated on a bottom surface thereof to form a step. If the gate insulating layer 102 has different thicknesses in the high voltage and low voltage regions, the first high voltage trench region 116 may be deeper than at the low voltage trench region.

Figure 16:
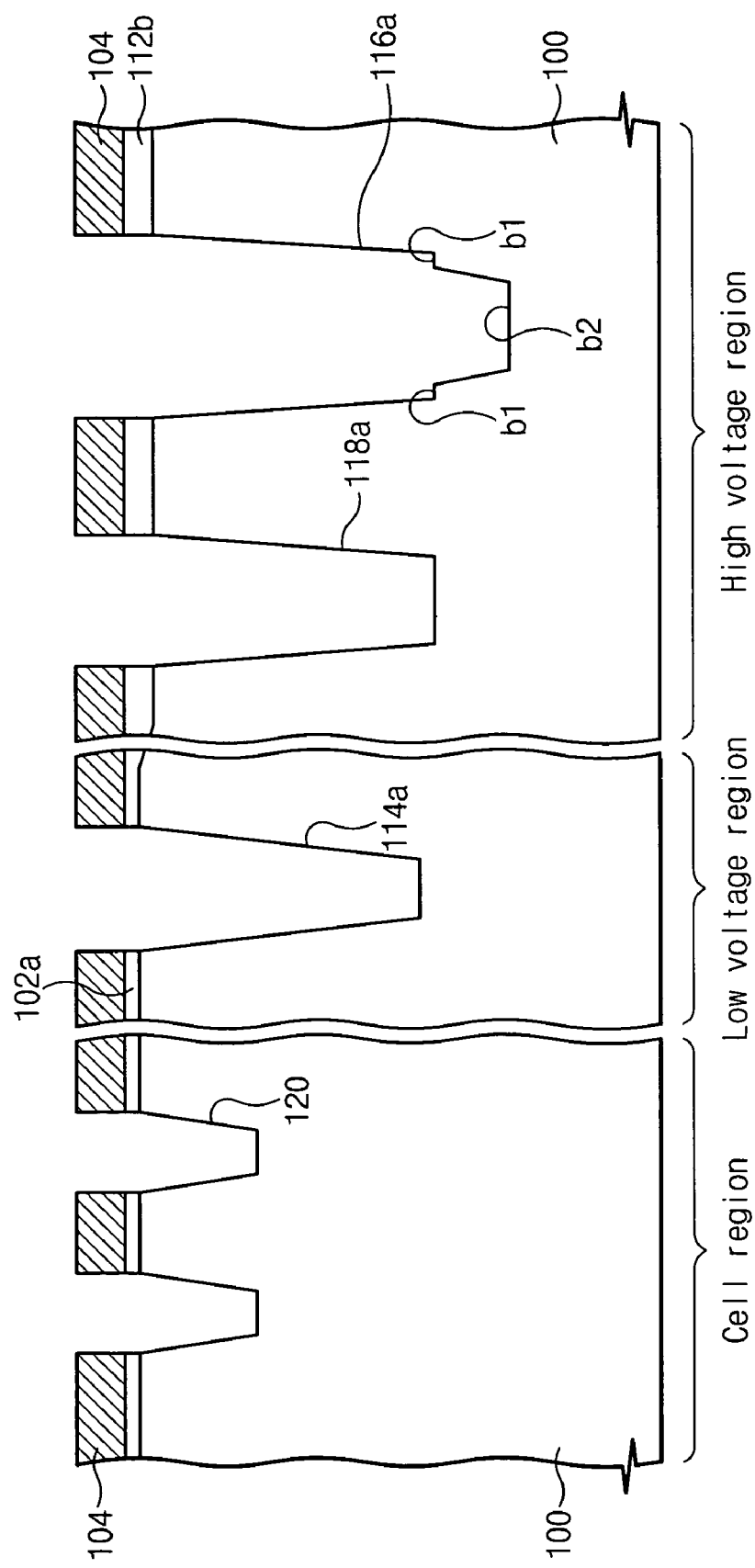

Referring to FIG. 16, the second resist layer 110 is removed, and exposed portions of the substrate are etched using the mask layer 104 as an etch mask to form a cell trench 120 in a cell region. Exposed portions of the substrate in the low voltage region and the high voltage region are etched to form a low voltage trench 114a in the low voltage region and first and second high voltage trenches 116a and 118a in the high voltage region. A step including a first bottom surface b1 and a second bottom surface b2 deeper than the first bottom surface b1 is formed in the first high voltage trench 116a.

In the illustrated operations, no additional mask processes are required to form the cell trench 120 in the cell region. In some embodiments of the present invention, trenches with various depths may be formed using fewer mask processes than the number of different trench depths.

The cell trench 120, the low voltage trench 114a and the first and the second high voltage trenches 116a and 118a may be filled with an insulating layer to form device isolation regions. A gate insulating layer and gate may be formed after completion of the device isolation regions. If the mask layer 104 includes a material for forming a gate electrode, a gate insulating layer in the low voltage region becomes a low voltage gate insulating layer 104a, and a gate insulating layer in the high voltage region becomes a high voltage gate insulating layer 104b.

Figure 17:
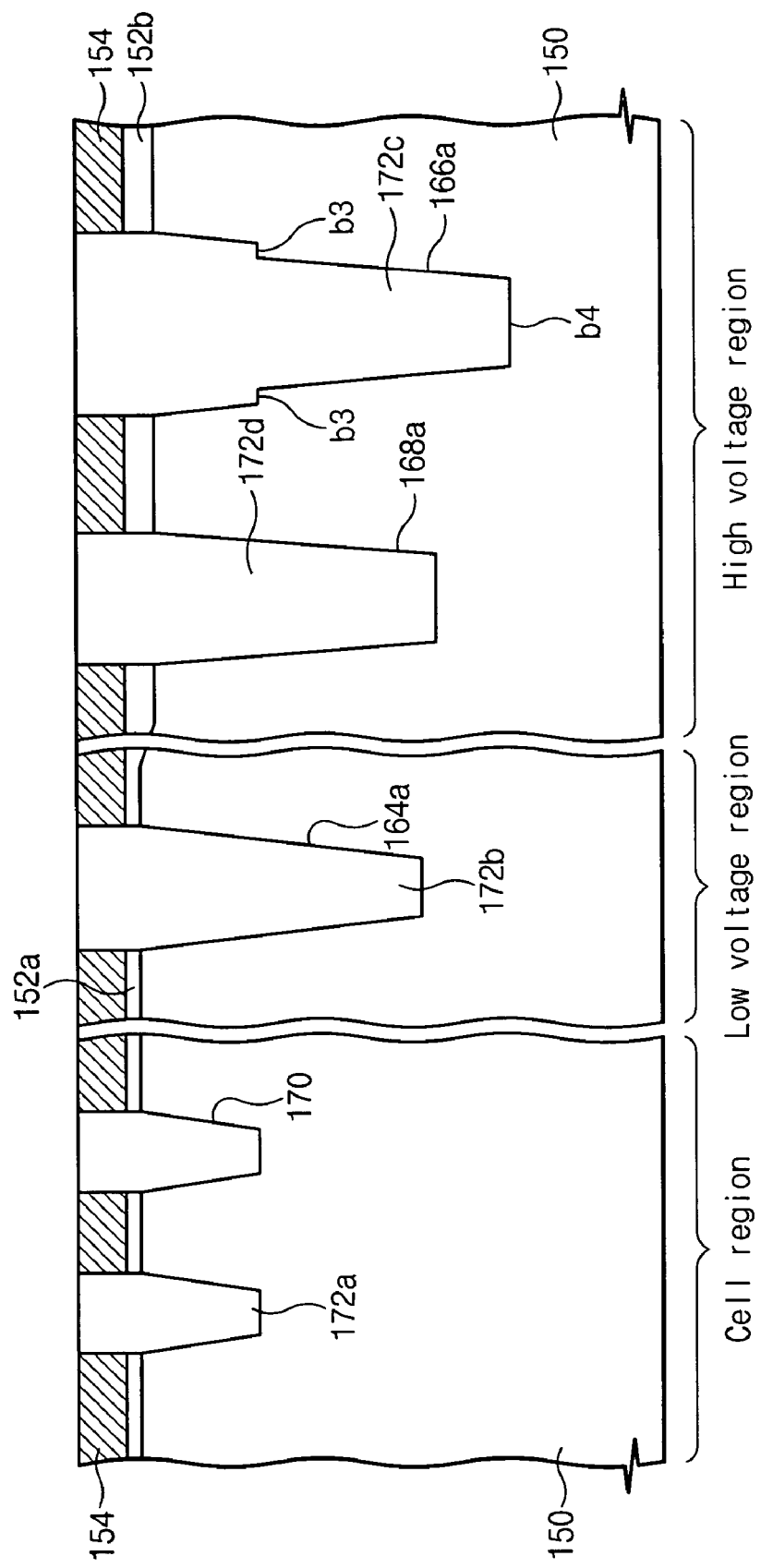
FIG. 17 is a cross-sectional view illustrating a device isolation structure of a semiconductor device in accordance with third embodiments of the present invention.

FIG. 17 is a cross-sectional view illustrating a device isolation structure in accordance with third embodiments of the present invention. Referring to FIG. 17, a cell trench 170, a low voltage trench 164a, a first high voltage trench 166a and a second high voltage trench 168a are formed in a semiconductor substrate on which a cell region, a low voltage region and a high voltage region are defined. A cell trench isolation layer 172a, a low voltage trench isolation layer 172b, a first high voltage trench isolation layer 172c and a second high voltage trench isolation layer 172c are formed in the cell trench 170, the low voltage trench 164A, the first high voltage trench 166A and the second high voltage 168A, respectively.

Like the above-described second embodiments, the first high voltage trench isolation layer 172c is different from that of the first embodiments. In the first embodiments, the first high voltage trench isolation layer 172c has a single bottom structure. In the third embodiments, the first high voltage trench isolation layer 172c has a stepped bottom structure including a first bottom surface b3 and a second bottom surface b4 deeper than the first bottom surface b3. Accordingly, a step is formed on a bottom of the first high voltage trench isolation layer 172c. Unlike the second embodiments, in the third embodiments, the first bottom b3 has a depth corresponding to a bottom of the cell trench 170.

The first high voltage trench isolation layer 172d has a width that decreases below the first bottom surface b3. The gate insulating layers 152a and 152b and the mask layer 154 are the same as described above for the first and the second embodiments.

Figure 18:
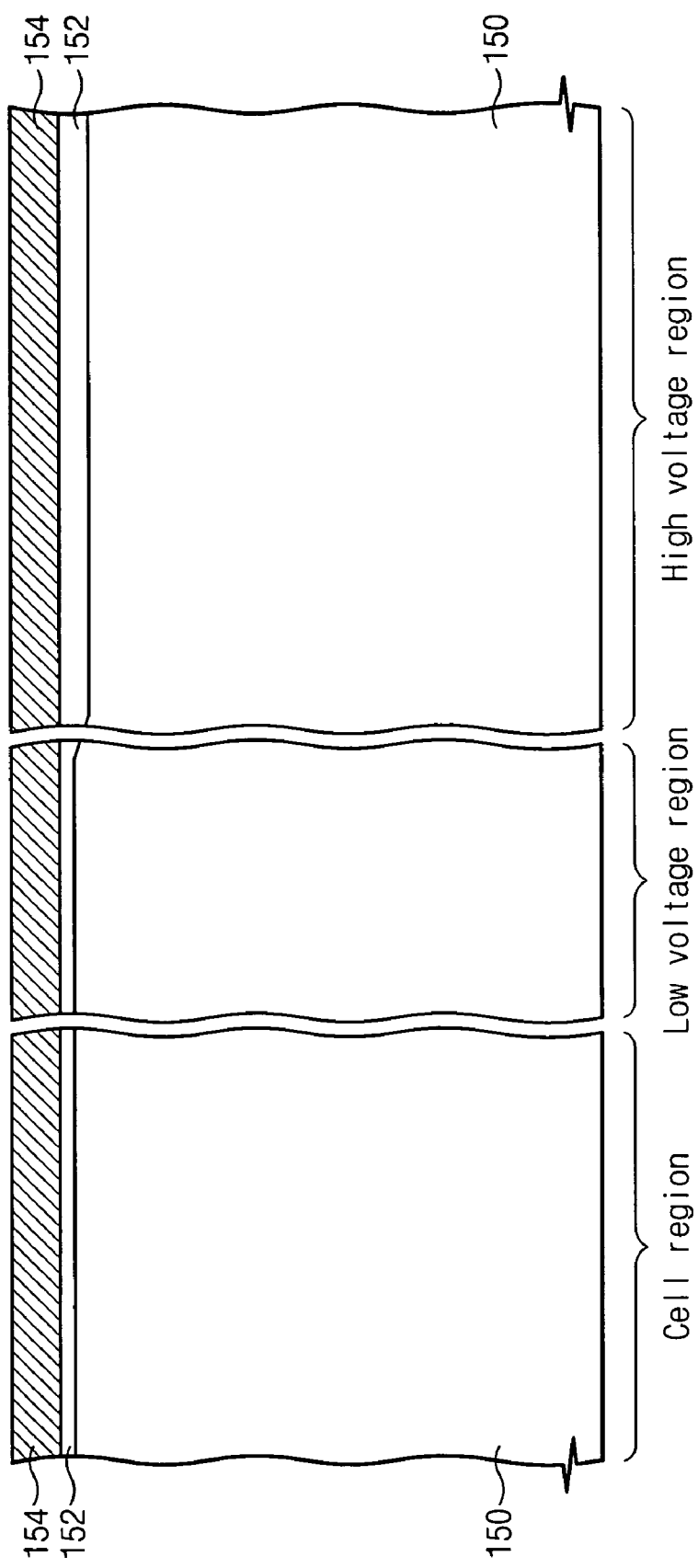
FIGS. 18 to 23 are cross-sectional views illustrating operations for forming a device isolation structure of a semiconductor device in accordance with the third embodiments of the present invention.

FIGS. 18 to 23 are cross-sectional views illustrating operations for forming the device isolation structure in accordance with the third embodiments of the present invention. Referring to FIG. 18, a gate insulating layer 152 is formed on a semiconductor substrate 150, and a mask layer 154 is formed on the gate insulating layer 152. The gate insulating layer 152 may have different materials and/or thicknesses in a cell region, a low voltage region and a high voltage region. For example, as shown in FIG. 18, a thick gate insulating layer may be formed in the high voltage region in relation to the low voltage region. The gate insulating layer formed in the cell region may have various structures and/or materials in accordance with the kind of semiconductor device being fabricated. For example, for a flash memory device, a gate insulating layer in a cell region may be thin enough to allow charge tunneling. In a charge-trapped memory device, such as a SONOS, a gate insulating layer in a cell region may have multiple insulating layers, including a charge storage layer.

The mask layer 154 may be a sacrificial layer used as an etch stop layer in etching a substrate, but may also include a conductive layer for forming a gate electrode. If the mask layer 154 includes a conductive layer, an etch stop layer may be formed on the conductive layer. If the mask layer 154 is a sacrificial layer, the gate insulating layer may be replaced with a buffer insulating layer, and a gate insulating layer may be formed after forming device isolation regions.

Figure 19:
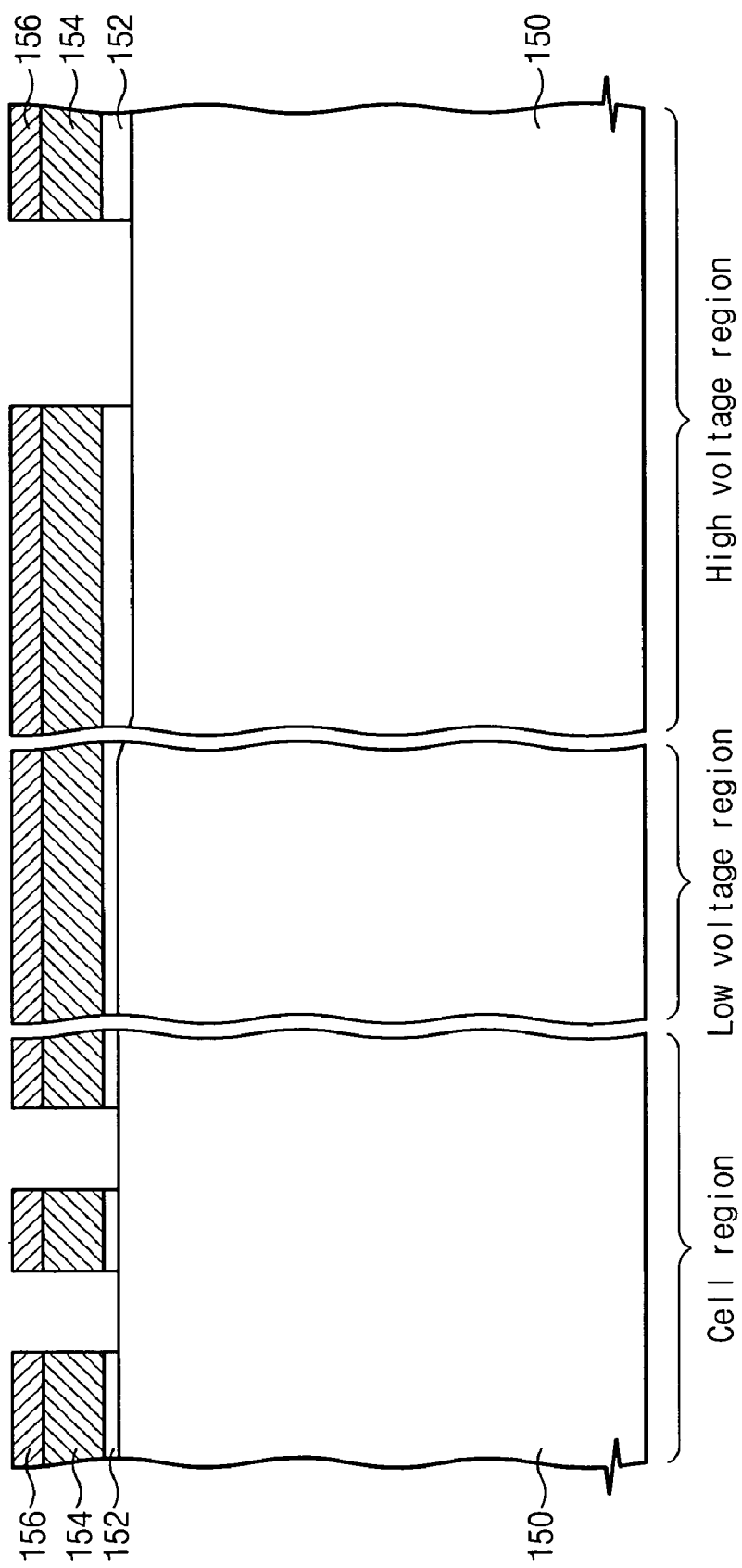

Referring to FIG. 19, a first resist layer 156 is formed on the mask layer 154 and patterned to expose portions of the mask layer 154 in the cell region and the high voltage region. The mask layer 154 is etched using the resist layer 156 as an etch mask to expose portions of the substrate in the cell region and the high voltage region. The openings in the first resist layer 156 correspond to regions where a cell trench and a high voltage trench are to be formed.

Figure 20:
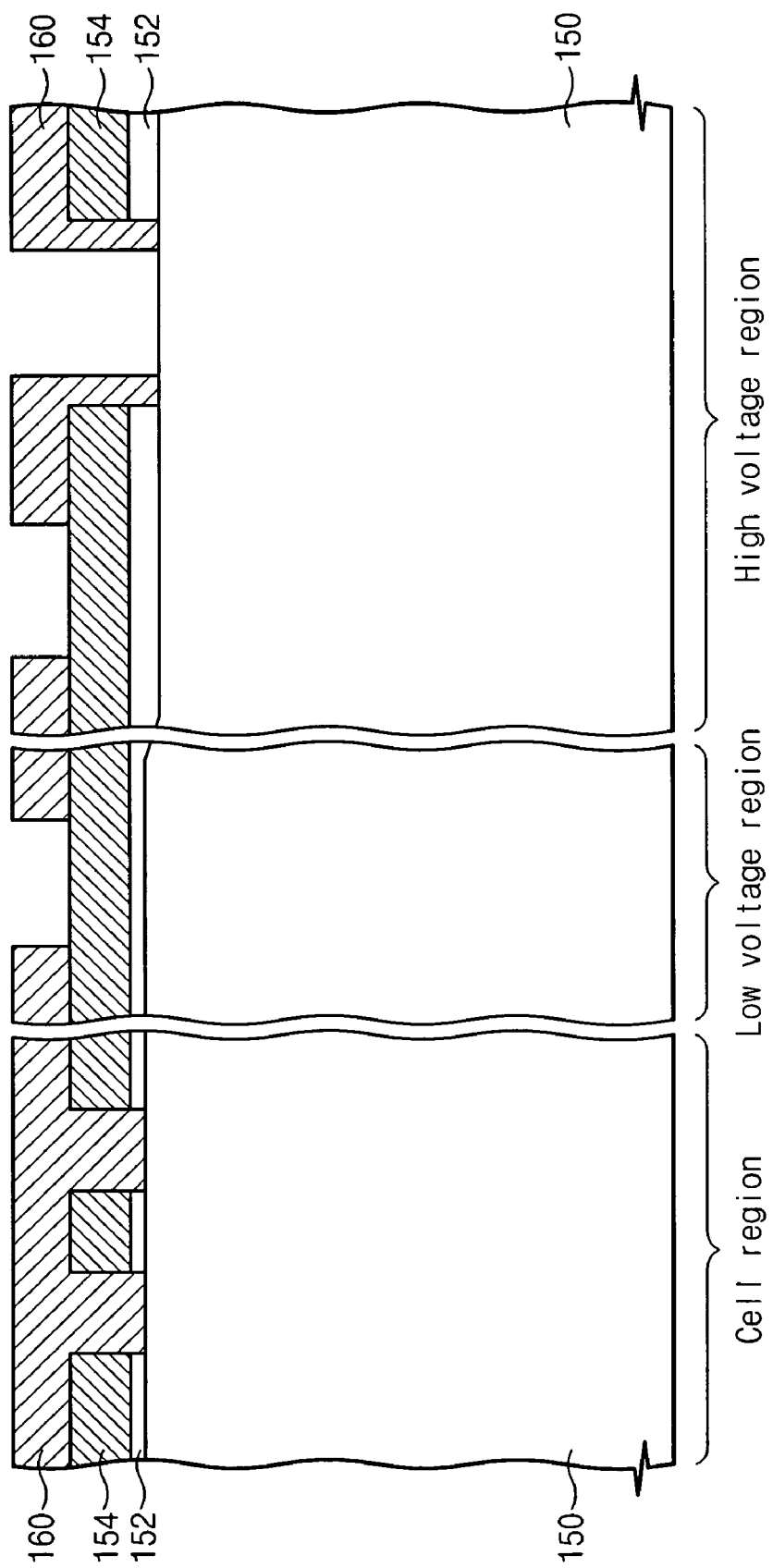

Referring to FIG. 20, after the first resist layer 156 is removed, a second resist layer 160 is formed and patterned to expose portions of the substrate in the low voltage region and the high voltage region. The second resist layer 160 covers previously exposed portions of the substrate in the cell region and the high voltage region. The openings in the second resist layer 160 correspond where trenches are to be formed in the low voltage region and the high voltage regions to be formed.

Figure 21:
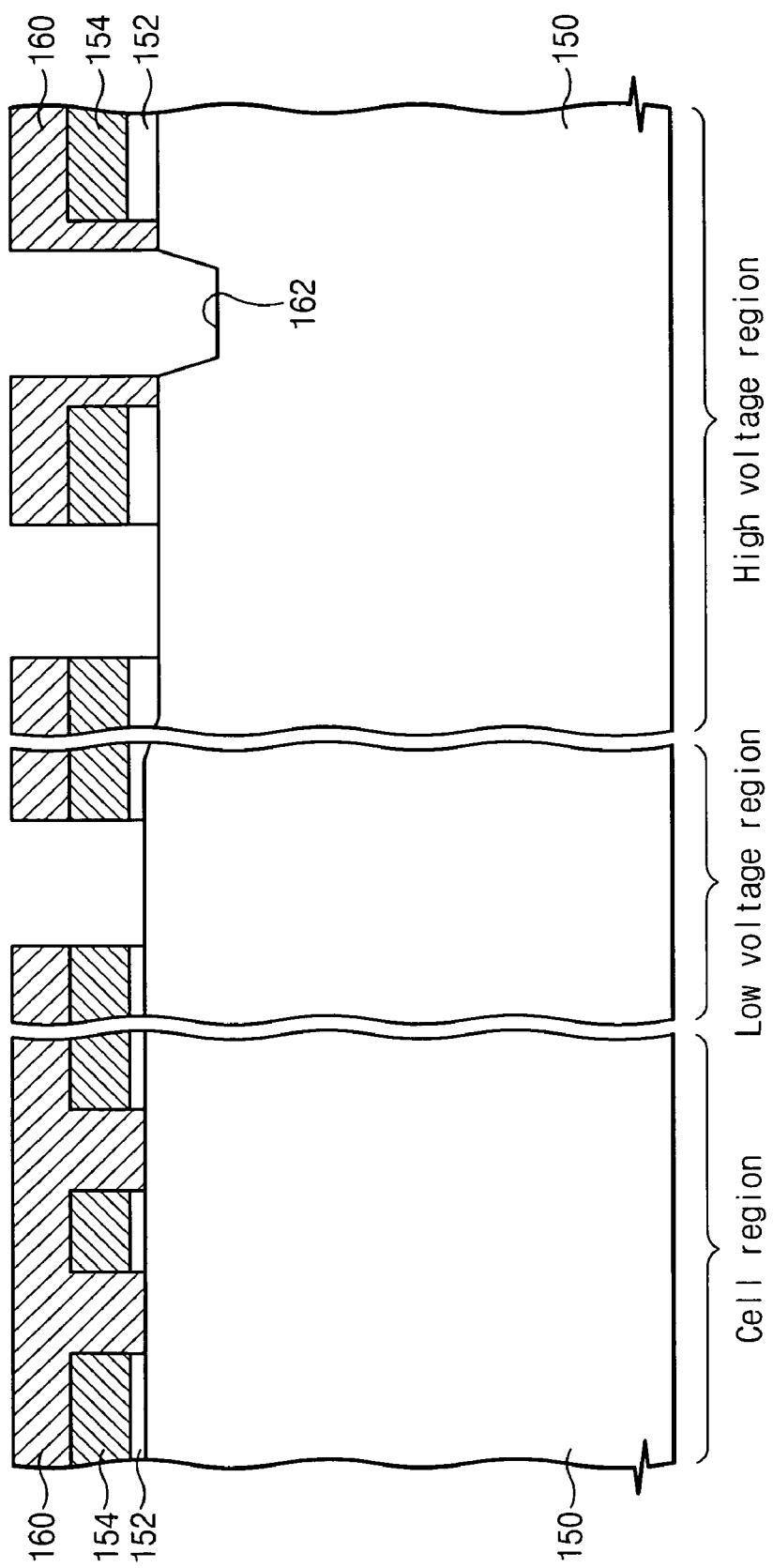

Referring to FIG. 21, the mask layer 154 and the gate insulating layer 152 are etched using the second resist layer 160 as an etch mask. A portion of the substrate exposed in the high voltage region is etched to form a recess 162. The etching involves an etch process with a high etch rate for the semiconductor substrate and the mask layer 154.

Figure 22:
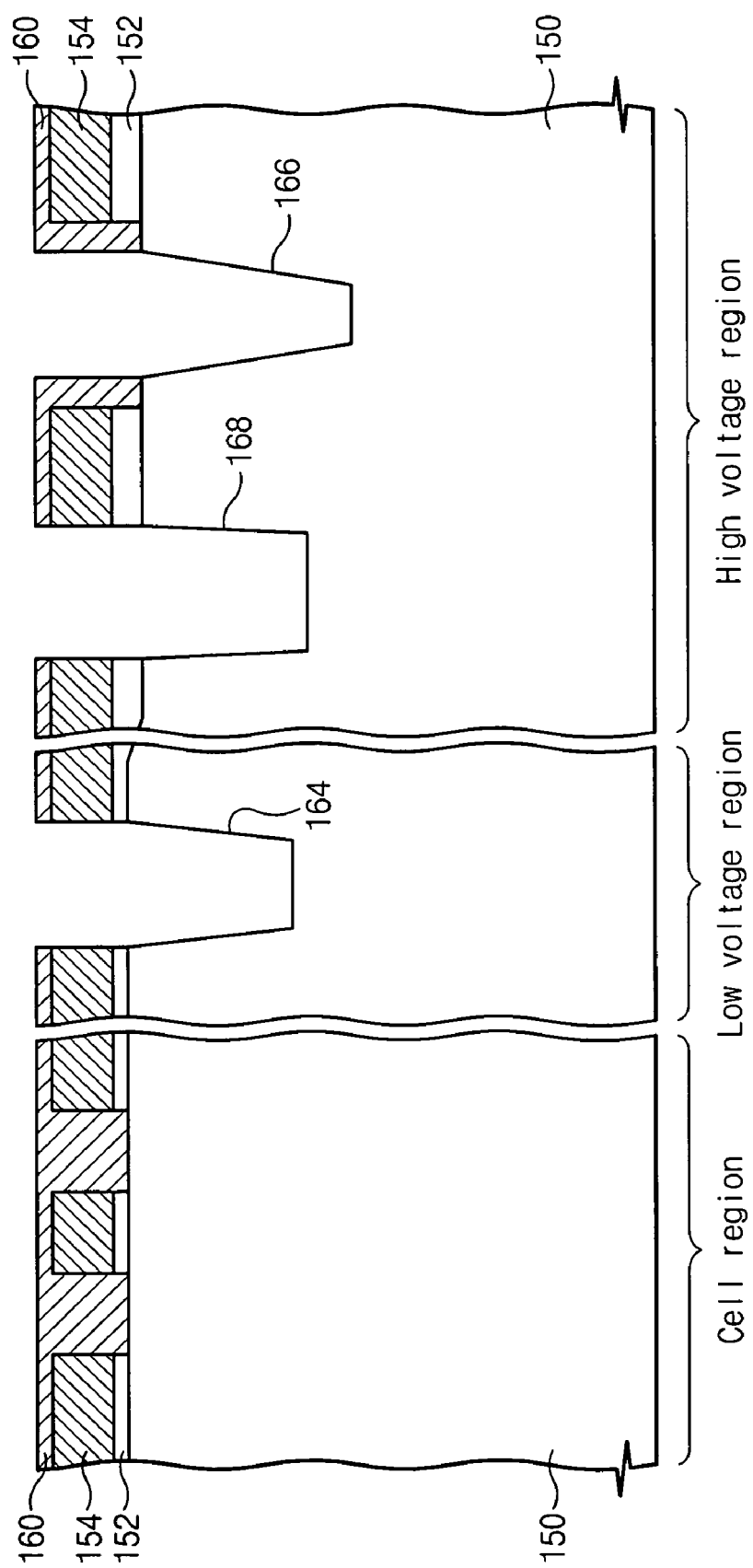

Referring to FIG. 22, exposed portions of the substrate in the low voltage region and the high voltage region are etched using the second resist layer 160 as an etch mask. The recess 162 is further etched when a semiconductor substrate in the other regions is etched. As a result, a low voltage trench 164 is formed in the low voltage region, and a first high voltage trench 166 and a second high voltage trench 168 are formed in the high voltage region. The first high voltage trench 166 is additionally etched in relation to the recess 162. Accordingly, the first high voltage trench 168 is relatively deeper than the low voltage trench 164 and the second high voltage trench 166. If a gate insulating layer is formed to have different thicknesses at a high voltage region and at a low voltage region, the first high voltage trench 166 may be deeper than the low voltage trench 164. If the gate insulating layer is formed to have the same thickness in both regions, the first high voltage trench 166 may not be deeper than the low voltage trench 164.

Figure 23:
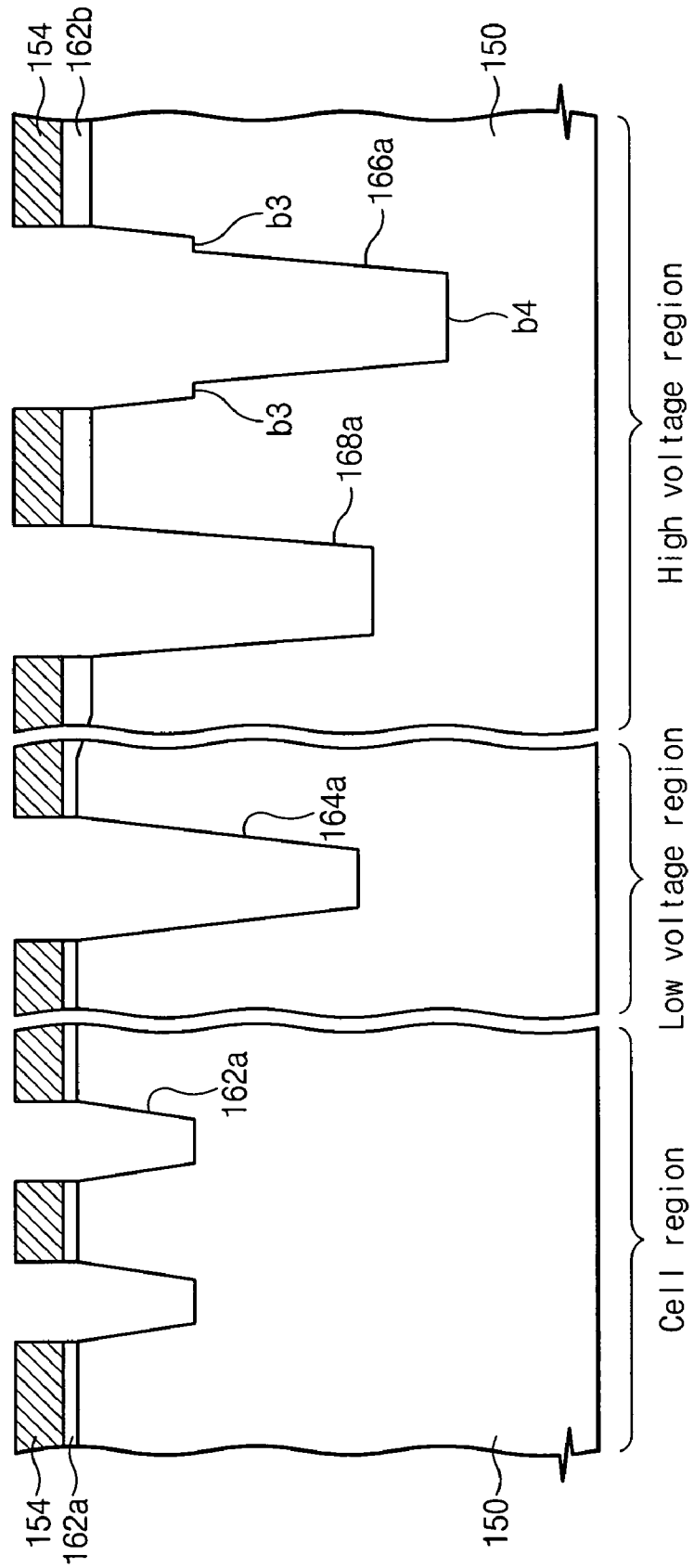

Referring to FIG. 23, the second resist layer 160 is removed, and exposed portions of the substrate are etched using the mask layer 154 as an etch mask, thus forming a cell trench 170 in the cell region. Exposed portions of the substrate in the low voltage region and the high voltage region are etched to form a low voltage trench 164a in the low voltage region, and a first high voltage trench 166a and a second high voltage trench 168a in the high voltage region. As a portion of the substrate around the first high voltage trench region 166 is exposed, a step is formed at the bottom of the first high voltage trench 166a. As illustrated in FIG. 23, the first high voltage trench 166a has a stepped bottom surface including a first bottom surface b3 and a second bottom surface b4 deeper than the first bottom surface b3. When the cell trench 170 is formed, a portion of the substrate around the first high voltage trench 166 is etched to form the second bottom surface b3. Accordingly, the first bottom surface b3 has a depth substantially corresponding to a bottom surface of the cell trench 170.

No additional mask processes are required to form a cell trench 170 in the cell region. Accordingly, trenches with various depths may be formed using a number of mask processes less than the number of different trench depths. In other words, a depth of a trench is increased with a regular depth from the deepest depth to the shallowest depth, and a depth of a trench formed through the same processes using a difference in a thickness of a gate insulating layer may be differently formed.

The cell trench 170, the low voltage trench 164a and the first and the second voltage trenches 166a and 168a may be filled with an insulating layer to form device isolation regions. The mask layer 154 and the gate insulating layer 152 may be removed after the device isolation regions are formed. A gate insulating layer may be formed thereafter. If the mask layer 154 includes a material for forming a gate electrode, a gate insulating layer formed in the low voltage region becomes a low voltage gate insulating layer 154a, and a gate insulating layer formed in the high voltage region becomes a high voltage gate insulating layer 154b.

According to some embodiments of the present invention, a trench with a relatively low aspect ratio may be formed in a region with a high pattern density, and a deep trench may be formed in a region requiring an isolation of a device at a high operation voltage to improve device isolation. In addition, as device isolation regions with various depths may be formed using fewer mask processes, fabrication may be simplified. Furthermore, it is possible to form trench isolation regions with different depths using a difference of a thickness of a gate insulating layer, without requiring an additional mask process.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims.

What is claimed is:

1. A method of forming a trench isolation structure in a semiconductor device, the method comprising:
    defining a cell region, a low voltage region and a high voltage region in a semiconductor substrate, the cell region, the low voltage region and the high voltage region including respective sites for a cell trench isolation region, a low voltage trench isolation region and a high voltage trench isolation region, respectively;
    forming a mask layer on the substrate;
    patterning the mask layer to form a mask pattern that exposes a portion of the substrate in the cell region and a portion of the substrate in the high voltage region;
    forming a resist pattern that covers the exposed portion of the substrate in the cell region and that exposes a portion of the mask pattern in the low voltage region and a portion of the substrate in the high voltage region;
    etching exposed portions of the mask pattern and the substrate using the resist pattern as an etch mask to expose a portion of the substrate in the low voltage region and to form a recess at the site for the high voltage trench isolation region;
    simultaneously etching portions of the substrate in the low voltage region and the recess without etching the site for the cell trench isolation region to form a low voltage trench at the site for the low voltage trench isolation region in the low voltage region and a high voltage trench deeper than the low voltage trench at the site for the high voltage trench isolation region in the high voltage region;
    simultaneously etching portions of the substrate in the cell region, the low voltage trench and the high voltage trench to form a cell trench at the site for the cell trench isolation region in the cell region and to deepen the low voltage trench in the low voltage region and the high voltage trench in the high voltage region; and
    filling the cell trench, the low voltage trench and the high voltage trench with insulating material to form a trench isolation structure comprising the cell trench isolation region in the cell region, the low voltage trench isolation region in the low voltage region, and the high voltage trench isolation region in the high voltage region.

2. The method of claim 1, wherein simultaneously etching portions of the low voltage region and the recess without etching the site for the cell trench isolation region to form a low voltage trench at the site for the low voltage trench isolation region in the low voltage region and a high voltage trench deeper than the low voltage trench at the site for the high voltage trench isolation region in the high voltage region comprises etching the recess and a portion of the substrate around the recess to form a step in the high voltage trench.

3. The method of claim 1, wherein simultaneously etching portions of the cell region, the low voltage trench and the high voltage trench to form a cell trench at the site for the cell trench isolation region in the cell region and to deepen the low voltage trench in the low voltage region and the high voltage trench in the high voltage region comprises etching the high voltage trench and a portion of the substrate around the high voltage trench to deepen the high-voltage trench and form a step in the high voltage trench.

4. The method of claim 1, wherein the resist pattern further exposes a portion of the mask pattern around the exposed substrate in the high voltage region, and wherein etching exposed portions of the mask pattern using the resist pattern as an etch mask to expose a portion of the substrate in the low voltage region and to form the recess comprises etching the mask pattern to expose a portion of the semiconductor substrate around the recess.

5. The method of claim 1, further comprising: removing the resist pattern to expose the mask pattern and portions of the semiconductor substrate; and etching exposed portions of the semiconductor substrate in the cell region, the low voltage region and the high voltage region using the mask pattern as an etch mask to form a cell trench in the cell region, and to deepen the low voltage trench and the high voltage trench.

6. The method of claim 1, wherein forming a resist pattern that exposes a portion of the mask pattern in the low voltage trench and a portion of the substrate in the high voltage region comprises forming a resist pattern that exposes a portion of the mask pattern in the low voltage trench and a portion of the substrate in the high voltage region and that includes a portion that overlaps a sidewall of the mask pattern adjacent the exposed portion of the substrate in the high voltage region and wherein etching exposed portions of the mask pattern and the substrate using the resist pattern as an etch mask to expose a portion of the substrate in the low voltage region and to form the recess comprises forming the recess adjacent the portion of the resist pattern that overlaps the sidewall of the mask layer.

7. A method for forming a trench isolation structure in a semiconductor device, the method comprising:
  defining a cell region, a low voltage region and a high voltage region in a semiconductor substrate;
  forming a gate insulating layer on the cell region, the low voltage region and the high voltage region, wherein the gate insulating layer in the high voltage region is thicker than the gate insulation layer in the low voltage region;
  forming a mask layer on the gate insulating layer;
  patterning the mask layer and the gate insulating layer to form a mask pattern that exposes portions of the substrate in the cell region and the high voltage region;
  forming a resist pattern that covers the exposed portion of the substrate in the cell region and exposes a portion of the mask pattern in the low voltage region and a portion of the substrate in the high voltage region;
  etching the exposed portions of the mask pattern and the substrate using the resist pattern as an etch mask to form a recess in the high voltage region and to expose a portion of the substrate in the low voltage region;
  removing the resist pattern to expose a portion of the substrate in the cell region;
  etching portions of the substrate exposed in the cell region, the low voltage region and the high voltage region to form a cell trench in the cell region, a low voltage trench deeper than the cell trench in the low voltage region, a first high voltage trench deeper than the low voltage trench and a second high voltage trench in the high voltage region that is deeper than the low voltage trench and shallower than the first high voltage trench; and
  forming insulating regions in the cell trench, the low voltage trench and the first and second high voltage trenches.

8. A method for forming a trench isolation structure in a semiconductor device, the method comprising:
  defining a cell region, a low voltage region and a high voltage region in a semiconductor substrate;
  forming a gate insulating layer on the cell region, the low voltage region and the high voltage region, wherein the gate insulating layer formed on the high voltage region is thicker than on the low voltage region;
  forming a mask layer on the gate insulating layer;
  patterning the mask layer and the gate insulating layer to form a mask pattern that exposes portions of the substrate in the cell region and the high voltage region;
  forming a resist pattern that covers the portion of the substrate exposed in the cell region, that exposes portions of the mask layer in the low voltage region and the high voltage region, and that exposes a portion of the substrate in the high voltage region and a portion of the mask layer around the exposed portion of the substrate;
  etching the exposed portions of the mask pattern and the substrate using the resist pattern as an etch mask to form a recess in the high voltage region and to expose portions of the substrate in the high voltage region and the low voltage region;
  simultaneously etching the exposed portions of the substrate in the high voltage region, the low voltage region and the recess using the resist pattern as an etch mask to form a first high voltage trench in the recess, a second high voltage trench in the high voltage region and a low voltage trench in the low voltage region;
  removing the resist pattern to expose a portion of the substrate in the cell region;
  etching exposed portions of the substrate in the cell region, the high voltage region and the low voltage region to form a cell trench in the cell region and to deepen the low voltage trench, the first high voltage trench and the second high voltage trench, such that the low voltage trench is deeper than the cell trench, the second high voltage trench is deeper that the low voltage trench, and the first low voltage trench is deeper than the second high voltage trench; and
  forming insulating regions in the cell trench, the low voltage trench and the first and second high voltage trenches.

9. A method for forming a trench isolation structure in a semiconductor device, the method comprising:
  defining a cell region, a low voltage region mad a high voltage region in a semiconductor substrate;
  forming a gate insulating layer in the cell region, the low voltage region and the high voltage region, the gate insulating layer on the high voltage region thicker than on the low voltage region;
  forming a mask layer on the gate insulating layer;
  patterning the mask layer and the gate insulating layer to form a mask pattern that exposes portions of the substrate in the cell region and the high voltage region;
  forming a resist pattern that covers the exposed portion of the substrate in the cell region, that partially covers the exposed portion of the substrate in the high voltage region and that exposes portions of the mask pattern in the low voltage region and the high voltage region;

etching exposed portions of the substrate and the mask region using the resist pattern as an etch mask to form a recess in the high voltage region and to expose portions of the substrate in the high voltage region and the low voltage region;

etching the exposed portions of the substrate in the high voltage region, the low voltage region and the recess using the resist pattern as an etch mask to form a low voltage trench in the low voltage region, a first high voltage trench at the recess and a second high voltage trench in the high voltage region;

removing the resist pattern to expose a portion of the substrate in the cell region and a portion of the substrate around the high voltage trench;

etching the exposed portion of the substrate in the cell region, the low voltage trench and the first and second high voltage trenches to form a cell trench in the cell region and to deepen the low voltage trench and the first and second high voltage trenches such that the low voltage trench is deeper than the cell trench, the second high voltage trench is deeper than the low voltage trench, and the first high voltage trench is deeper than the second high voltage trench; and forming insulating regions in the cell trench, the low voltage trench and the first and second high voltage trenches.

* * * * *